(12) United States Patent
Inoue et al.

(10) Patent No.: US 7,393,471 B2
(45) Date of Patent: Jul. 1, 2008

(54) ANISOTROPIC CONDUCTIVE SHEET, ITS MANUFACTURING METHOD, AND ITS APPLICATION

(75) Inventors: Kazuo Inoue, Tokyo (JP); Katsumi Sato, Tokyo (JP)

(73) Assignee: JSR Corporation, Tokyo (JP)

( * ) Notice: Subject to any disclaimer, the term of this patent is extended or adjusted under 35 U.S.C. 154(b) by 428 days.

(21) Appl. No.: 10/525,089

(22) PCT Filed: Aug. 26, 2003

(86) PCT No.: PCT/JP03/10747

§ 371 (c)(1),
(2), (4) Date: Feb. 23, 2005

(87) PCT Pub. No.: WO2004/021516

PCT Pub. Date: Mar. 11, 2004

(65) Prior Publication Data

US 2006/0084297 A1    Apr. 20, 2006

(30) Foreign Application Priority Data

Aug. 27, 2002  (JP)  ............................ 2002-247396

(51) Int. Cl.
*H01B 1/00*   (2006.01)
*H01R 4/58*   (2006.01)
*H01L 23/58*  (2006.01)

(52) U.S. Cl. ............................ 252/500; 439/91; 257/48
(58) Field of Classification Search ................. 252/500; 439/91; 257/48
See application file for complete search history.

(56) References Cited

U.S. PATENT DOCUMENTS

2006/0084297 A1    4/2006   Inoue et al.

FOREIGN PATENT DOCUMENTS

| JP | 11-307782   | * | 5/1999  |
| JP | 11-307782   |   | 11/1999 |
| JP | 2001-289874 |   | 10/2001 |
| JP | 2002-203879 | * | 7/2002  |

(Continued)

OTHER PUBLICATIONS

European Search Report, Apr. 11, 2007.

(Continued)

*Primary Examiner*—Mark Kopec
*Assistant Examiner*—Jaison P Thomas
(74) *Attorney, Agent, or Firm*—Oblon, Spivak, McClelland, Maier & Neustadt, P.C.

(57) ABSTRACT

An anisotropically conductive sheet which does not contaminate an object of connection, does not adhere to the object of connection even when it is left to stand for a long period of time in a state pressurized by the object of connection under a high-temperature environment and can prevent or inhibit electric charge from being accumulated to eliminate an adverse influence by static electricity, a production process thereof, and applications thereof. The anisotropically conductive sheet has an anisotropically conductive sheet body formed by an elastic polymeric substance and having a plurality of conductive parts extending in a thickness-wise direction of the sheet body and an insulating part mutually insulating these conductive parts, and a DLC film integrally formed on one or both surfaces of the anisotropically conductive sheet body so as to cover at least the insulating part.

12 Claims, 13 Drawing Sheets

FOREIGN PATENT DOCUMENTS

JP         2002-208447    *    7/2002

OTHER PUBLICATIONS

U.S. Appl. No. 10/525,089, filed Feb. 23, 2005, Inoue et al.
U.S. Appl. No. 10/560,347, filed Dec. 12, 2005, Yamada et al.
U.S. Appl. No. 10/552,995, filed Oct. 13, 2005, Sato et al.
U.S. Appl. No. 10/548,832, filed Sep. 13, 2005, Igarashi et al.
U.S. Appl. No. 11/837,873, filed Aug. 13, 2007, Sato et al.

* cited by examiner

ANISOTROPIC CONDUCTIVE SHEET, ITS MANUFACTURING METHOD, AND ITS APPLICATION

TECHNICAL FIELD

The present invention relates to an anisotropically conductive sheet suitable for use as a connector used in electrical inspection of circuit devices such as semiconductor integrated circuits, a production process thereof, and applications thereof.

BACKGROUND ART

An anisotropically conductive sheet is a sheet exhibiting conductivity only in its thickness-wise direction or having pressure-sensitive conductive conductor parts exhibiting conductivity only in its thickness-wise direction when it is pressurized in the thickness-wise direction. Since the anisotropically conductive sheet has such features that compact electrical connection can be achieved without using any means such as soldering or mechanical fitting, and that soft connection is feasible with mechanical shock or strain absorbed therein, it is widely used as a connector for achieving electrical connection between a circuit device, for example, a printed circuit board, and a leadless chip carrier, liquid crystal panel or the like in fields of, for example, electronic computers, electronic digital clocks, electronic cameras and computer key boards.

On the other hand, in electrical inspection of circuit devices such as semiconductor integrated circuit devices such as packaged ICs and MCMs, wafers, on which integrated circuits have been formed, and printed circuit boards, in order to achieve electrical connection between electrodes to be inspected formed on one surface of a circuit device, which is an object of inspection, and electrodes for inspection formed on the surface of a circuit board for inspection, it is conducted to cause an anisotropically conductive elastomer sheet to intervene between an electrode region to be inspected of the circuit device and an electrode region for inspection of the circuit board for inspection.

As such anisotropically conductive elastomer sheets, those of various structures have heretofore been known. For example, Japanese Patent Application Laid-Open No. 93393/1976 discloses an anisotropically conductive elastomer sheet (hereinafter referred to as "dispersion type anisotropically conductive elastomer sheet") obtained by uniformly dispersing metal particles in an elastomer, and Japanese Patent Application Laid-Open No. 147772/1978 discloses an anisotropically conductive elastomer sheet (hereinafter referred to as "uneven distribution type anisotropically conductive elastomer sheet") obtained by unevenly distributing conductive magnetic particles in an elastomer to form a great number of conductive parts extending in a thickness-wise direction thereof and an insulating part mutually insulating them. Further, Japanese Patent Application Laid-Open No. 250906/1986 discloses an uneven distribution type anisotropically conductive elastomer sheet with a difference in level defined between the surface of each conductive part and an insulating part.

In the uneven distribution type anisotropically conductive elastomer sheet, since the conductive parts are formed in accordance with a pattern antipodal to a pattern of electrodes of a circuit device to be connected, it is advantageous compared with the dispersion type anisotropically conductive elastomer sheet in that electrical connection between electrodes can be achieved with high reliability even to a circuit device small in the arrangement pitch of electrodes to be connected, i.e., center distance between adjacent electrodes.

However, the conventional anisotropically conductive elastomer sheets have involved the following problems.

In electrical inspection of circuit devices such as semiconductor integrated circuit devices, a burn-in test that electrical inspection of circuit devices is conducted under a high-temperature environment is carried out for the purpose of sorting circuit devices having latent defects.

A burn-in test using an anisotropically conductive elastomer sheet will be specifically described. A circuit device to be inspected is arranged on one surface of the anisotropically conductive elastomer sheet, a circuit board for inspection is arranged on the other surface of the anisotropically conductive elastomer sheet, and they are pressurized in a thickness-wise direction thereof, whereby electrical connection between electrodes to be inspected of the circuit device to be inspected and inspection electrodes of the circuit board for inspection is achieved. The circuit device to be inspected is then heated to a prescribed temperature, and held for a prescribed period of time in this state. Thereafter, necessary electrical inspection of the circuit device to be inspected is performed.

Since an uncured low-molecular weight component remains in an elastic polymeric substance for forming the anisotropically conductive elastomer sheet, for example, silicone rubber, and the low-molecular weight component bleeds out to the surface of the anisotropically conductive elastomer sheet, however, the circuit device to be inspected coming into contact with the anisotropically conductive elastomer sheet is contaminated.

In addition, since the anisotropically conductive elastomer sheet bears adhesiveness at a high temperature because the low-molecular weight component remains therein, the anisotropically conductive elastomer sheet adheres to the circuit device to be inspected when it is held for a long period of time in a state brought into contact under pressure with the circuit board to be inspected under a high-temperature environment. As a result, a problem that one or both of the anisotropically conductive elastomer sheet and the circuit device to be inspected are damaged when both are separated from each other is involved.

On the other hand, when the burn-in test is conducted by causing a sheet-like connector to intervene between the anisotropically conductive elastomer sheet and the circuit device to be inspected, the contamination of the circuit device to be inspected with the low-molecular weight component and the adhesion of the anisotropically conductive elastomer sheet to the circuit device to be inspected can be avoided.

In such a case, however, the anisotropically conductive elastomer sheet adheres to the sheet-like connector. As a result, one or both of the anisotropically conductive elastomer sheet and the sheet-like connector are damaged when both are separated from each other. In addition, when the anisotropically conductive elastomer sheet adheres to the sheet-like connector, the sheet-like connector causes bent. When the sheet-like connector is used in electrical inspection of a circuit device in this state, it is thus difficult to achieve stable electrical connection to all electrodes to be inspected in the circuit device to be inspected.

Further, when a conventional anisotropically conductive elastomer sheet is used in electrical inspection of a circuit device having electrodes to be inspected, which are formed of solder, the following problem is involved.

Namely, when the anisotropically conductive elastomer sheet is used repeatedly over many times in a probe test of a circuit device having electrodes to be inspected, which are formed of solder or used repeatedly in a test under a high-temperature environment, for example, a burn-in test, a solder material forming the electrodes to be inspected adheres to the surface of the anisotropically conductive elastomer sheet and further diffuses into conductive particles. As a result, it is difficult to retain necessary conductivity.

In order to solve such a problem, there has been proposed a means for forming a metal layer having diffusion resistance to the solder material on the surfaces of conductive parts in the anisotropically conductive elastomer sheet (see, for example, Japanese Patent Application Laid-Open No. 2002-280092).

However, it is impossible to inhibit the adhesion of the solder material to the surface of the metal layer by such a means. After all, it is thus difficult to retain necessary conductivity over a long period of time.

Further, the conventional uneven distribution type anisotropically conductive elastomer sheets involve the following problem.

Since an insulating part of a considerably wide area is present in the uneven distribution type anisotropically conductive elastomer sheet, the surface of the insulating part of the uneven distribution type anisotropically conductive elastomer sheet is charged with static electricity according to usage or service environment of the uneven distribution type anisotropically conductive elastomer sheet, so that various problems arise.

For example, when the uneven distribution type anisotropically conductive elastomer sheet is used in electrical inspection of a circuit device, electrical connection between the circuit device to be inspected and a circuit board for inspection is achieved by causing this anisotropically conductive elastomer sheet to intervene between the circuit device to be inspected and the circuit board for inspection and pressurizing the anisotropically conductive elastomer sheet, thereby performing the electrical inspection. However, electric charge is easy to be generated by a pressurizing operation and a separating operation. Therefore, the electric charge is accumulated on the surface of the insulating part in the anisotropically conductive elastomer sheet when the electrical inspection of a great number of circuit devices is continuously conducted, whereby the surface of the insulating part comes to be charged with high-voltage static electricity.

When the static electricity is discharged through the conductive parts of the anisotropically conductive elastomer sheet, an adverse influence may be exerted on not only the conductive parts of the anisotropically conductive elastomer sheet and a wiring circuit of the circuit board for inspection, but also the circuit devices, which are objects of the inspection, in some cases. As a result, there is a possibility that the anisotropically conductive elastomer sheet and the circuit board for inspection may be damaged, or the circuit devices to be inspected may be broken.

DISCLOSURE OF THE INVENTION

The present invention has been made on the basis of the foregoing circumstances and has as its first object the provision of an anisotropically conductive sheet which does not contaminate an object of connection, does not adhere to the object of connection even when it is left to stand for a long period of time in a state pressurized by the object of connection under a high-temperature environment and can prevent or inhibit electric charge from being accumulated to eliminate an adverse influence by static electricity.

A second object of the present invention is to provide an anisotropically conductive sheet, by which necessary conductivity is retained over a long period of time even when the object of connection is composed of solder, in addition to the first object.

A third object of the present invention is to provide a process for producing an anisotropically conductive sheet which does not contaminate an object of connection, does not adhere to the object of connection even when it is left to stand for a long period of time in a state pressurized by the object of connection under a high-temperature environment and can prevent or inhibit electric charge from accumulating to eliminate an adverse influence by static electricity.

A fourth object of the present invention is to provide an anisotropically conductive connector, a probe for circuit inspection and a circuit inspection apparatus each equipped with any one of the anisotropically conductive sheets described above.

According to the present invention, there is provided an anisotropically conductive sheet comprising an anisotropically conductive sheet body formed by an elastic polymeric substance and having a plurality of conductive parts extending in a thickness-wise direction of the sheet body and an insulating part mutually insulating these conductive parts, and a DLC film integrally formed on one or both surfaces of the anisotropically conductive sheet body so as to cover at least the insulating part.

In the anisotropically conductive sheet according to the present invention, the surface resistivity of the DLC film may preferably be $1\times10^8$ to $1\times10^{14}$ $\Omega/\square$.

In the anisotropically conductive sheet according to the present invention, the thickness of the DLC film may preferably be 1 to 500 nm.

In the anisotropically conductive sheet according to the present invention, the elastic polymeric substance forming the anisotropically conductive sheet body may preferably be silicone rubber.

In the anisotropically conductive sheet according to the present invention, the DLC film may preferably be formed so as to cover the whole of one surface or the whole of both surfaces of the anisotropically conductive sheet body.

In the anisotropically conductive sheet according to the present invention, a metal layer may be integrally formed on one surface of the anisotropically conductive sheet body so as to cover the conductive parts.

In such an anisotropically conductive sheet, the DLC film may preferably be formed so as to cover the surface of the metal layer.

The surface resistivity of the metal layer may preferably be at most $1\times10^{-2}$ $\Omega/\square$.

The thickness of the metal layer may preferably be 5 to 1,000 nm.

According to the present invention, there is also provided a process for producing an anisotropically conductive sheet, which comprises the steps of producing an anisotropically conductive sheet body formed by an elastic polymeric substance and having a plurality of conductive parts extending in a thickness-wise direction of the sheet body and an insulating part mutually insulating these conductive parts, and integrally forming a DLC film on one or both surfaces of the anisotropically conductive sheet body thus obtained by a PVD method so as to cover at least the insulating part.

In the process according to the present invention for producing the anisotropically conductive sheet, the DLC film may preferably be formed at a temperature of at most 150° C.

In the process according to the present invention for producing the anisotropically conductive sheet, it may also be preferable that an ion etching treatment is conducted on a surface, on which the DLC film is to be formed, in the anisotropically conductive sheet body, and the DLC film is then formed.

According to the present invention, there is further provided an anisotropically conductive connector comprising a frame plate having openings and the above-described anisotropically conductive sheet arranged so as to close each of the openings in the frame plate and supported by an opening edge of the frame plate.

According to the present invention, there is still further provided a probe for circuit inspection, which comprises a circuit board for inspection, on the surface of which inspection electrodes have been formed in accordance with a pattern corresponding to a pattern of electrodes to be inspected of circuits, which are an object of inspection, and the above-described anisotropically conductive sheet or the above-described anisotropically conductive connector arranged on the surface of the circuit board for inspection.

According to the present invention, there is yet still further provided an anisotropically conductive connector suitable for use in conducting electrical inspection of each of a plurality of integrated circuits formed on a wafer in a state of the wafer, which comprises:

a frame plate, in which a plurality of openings have been formed correspondingly to regions, in which electrodes to be inspected have been arranged, in all the integrated circuits formed on the wafer, which is an object of inspection, and a plurality of anisotropically conductive sheets respectively arranged so as to close the openings in the frame plate and supported by their corresponding opening edges of the frame plate, wherein the anisotropically conductive sheets are each composed of the above-described anisotropically conductive sheet having the DLC film.

According to the present invention, there is yet still further provided a probe for circuit inspection that is suitable for use in conducting electrical inspection of each of a plurality of integrated circuits formed on a wafer in a state of the wafer, which comprises:

a circuit board for inspection, on the surface of which inspection electrodes have been formed in accordance with a pattern corresponding to a pattern of electrodes to be inspected in all the integrated circuits formed on the wafer, which is an object of inspection, and the above-described anisotropically conductive connector for wafer inspection arranged on the surface of the circuit board for inspection.

According to the present invention, there is yet still further provided an anisotropically conductive connector suitable for use in conducting electrical inspection of each of a plurality of integrated circuits formed on a wafer in a state of the wafer, which comprises:

a frame plate, in which a plurality of openings have been formed correspondingly to regions, in which electrodes to be inspected have been arranged, in a plurality of integrated circuits selected from among the integrated circuits formed on the wafer, which is an object of inspection, and a plurality of anisotropically conductive sheets respectively arranged so as to close the openings in the frame plate and supported by their corresponding opening edges of the frame plate, wherein the anisotropically conductive sheets are each composed of the above-described anisotropically conductive sheet having the DLC film.

According to the present invention, there is yet still further provided a probe for circuit inspection that is suitable for use in conducting electrical inspection of each of a plurality of integrated circuits formed on a wafer in a state of the wafer, which comprises:

a circuit board for inspection, on the surface of which inspection electrodes have been formed in accordance with a pattern corresponding to a pattern of electrodes to be inspected in a plurality of integrated circuits selected from among the integrated circuits formed on the wafer, which is an object of inspection, and the above-described anisotropically conductive connector for wafer inspection arranged on the surface of the circuit board for inspection.

In the probe for circuit inspection according to the present invention, a sheet-like connector composed of an insulating sheet and a plurality of electrode structures each extending through in a thickness-wise direction of the insulating sheet and arranged in accordance with a pattern corresponding to the pattern of the inspection electrodes in the circuit board for inspection may be arranged on the anisotropically conductive connector.

According to the present invention, there is yet still further provided a circuit inspection apparatus comprising the probe for circuit inspection.

EFFECTS OF THE INVENTION

According to the anisotropically conductive sheets of the present invention, the DLC film is formed on one surface or both surfaces of the anisotropically conductive sheet body so as to cover at least the insulating part, thereby a low-molecular weight component in the elastic polymeric substance forming the anisotropically conductive sheet body is prevented from bleeding out to the surface thereof. Therefore, such an anisotropically conductive sheet neither contaminates an object of connection with the low-molecular weight component nor adheres to the object of connection even when it is left to stand for a long period of time in a state pressurized by the object of connection under a high-temperature environment. In addition, since the surface resistivity of the DLC film is low compared with that of the elastic polymeric substance, electric charge can be prevented or inhibited from being accumulated on the surface of the anisotropically conductive sheet and an adverse influence by static electricity can be eliminated.

According to the construction that the DLC film is formed so as to cover the surfaces of the conductive parts, a solder material is sufficiently inhibited from adhering to the surface of the anisotropically conductive sheet even when electrodes, which are an object of connection, are composed of solder, so that necessary conductivity can be retained over a long period of time.

According to the process of the present invention for producing the anisotropically conductive sheet, there can be produced anisotropically conductive sheets which do not contaminate an object of connection, do not adhere to the object of connection even when they are left to stand for a long period of time in a state pressurized by the object of connection under a high-temperature environment and can eliminate an adverse influence by static electricity as electric charge is prevented or inhibited from being accumulated.

According to the anisotropically conductive connectors of the present invention, they have the anisotropically conductive sheets described above, so that an object of connection is not contaminated, and the anisotropically conductive sheets do not adhere to the object of connection even when they are left to stand for a long period of time in a state pressurized by the object of connection under a high-temperature environment and an adverse influence by static electricity is eliminated as electric charge is prevented or inhibited from being accumulated.

According to the probes for circuit inspection and the inspection apparatus for circuit devices of the present invention, circuit devices, which are an object of inspection, can be prevented from being contaminated, and the anisotropically conductive sheets can be prevented from adhering to the circuit devices or other members in the probes for circuit inspection even when they are left to stand for a long period of time in a state pressurized by the circuit devices under a high-temperature environment, whereby it can be avoided to damage the anisotropically conductive sheets, the circuit devices or other members in the probes for circuit inspection. In addition, since electric charge can be prevented or inhibited from being accumulated on the surfaces of the anisotropically conductive sheets, an adverse influence by static electricity can be eliminated.

DESCRIPTION OF CHARACTERS

| | | | |
|---|---|---|---|
| 1 | Wafer, | 2 | Electrodes to be inspected, |
| 5 | Wafer mounting table, | | |
| 10 | Anisotropically conductive sheet, | | |
| 11 | Anisotropically conductive sheet body, | | |
| 11A, 11B | Molding material layers, | | |
| 12 | Conductive parts, | | |
| 12A | Portions to become conductive parts, | | |
| 13 | Insulating part, | 14 | Metal layers, |
| 15 | DLC film, | 16 | Mask, |
| 17 | Openings, | 18 | Frame plate, |
| 19 | Openings, | | |
| 20 | Anisotropically conductive connector, | | |
| 25 | Probe for circuit inspection, | | |
| 30 | Circuit board for inspection, | | |
| 31 | Inspection electrodes, | 32 | Connection terminals, |
| 33 | Internal wirings, | 40 | Sheet-like connector, |
| 41 | Insulating sheet, | 42 | Electrode structures, |
| 43 | Front-surface electrode parts, | | |
| 44 | Back-surface electrode parts, | | |
| 45 | Short circuit parts, | | |
| 50 | Top force, | | |
| 51 | Ferromagnetic base plate, | | |
| 52 | Ferromagnetic substance layers, | | |
| 53 | Non-magnetic substance layers, | | |
| 54 | Spacer, | 55 | Bottom force, |
| 56 | Ferromagnetic base plate, | | |
| 57 | Ferromagnetic substance layers, | | |
| 58 | Non-magnetic substance layers, | | |
| P | Conductive particles | | |

BEST MODE FOR CARRYING OUT THE INVENTION

The embodiments of the present invention will hereinafter be described in details.

[Anisotropically Conductive Sheet]

Figure 1:
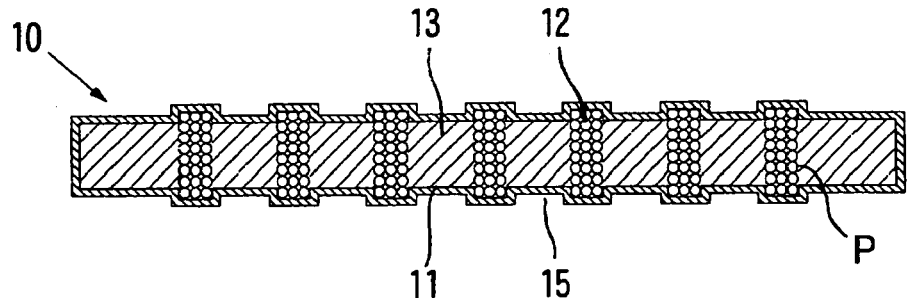
FIG. 1 is a cross-sectional view illustrating the construction of an exemplary anisotropically conductive sheet according to the present invention.

FIG. 1 is a cross-sectional view illustrating the construction of an exemplary anisotropically conductive sheet according to the present invention.

This anisotropically conductive sheet 10 has an anisotropically conductive sheet body 11 formed by an elastic polymeric substance. The anisotropically conductive sheet body 11 is constructed by a plurality of conductive parts 12 arranged in accordance with a pattern corresponding to a pattern of electrodes to be inspected of an object of connection, for example, a circuit device to be inspected, and respectively extending in a thickness-wise direction of the sheet body and an insulating part 13 for mutually insulating these conductive parts 12. In the conductive parts 12, conductive particles P exhibiting magnetism are contained at a high density in a state oriented so as to align in the thickness-wise direction. On the other hand, the insulating part 13 does not contain the conductive particles P at all or scarcely contains them. In the embodiment illustrated, the conductive parts 12 are formed so as to protrude from both surfaces of the insulating part 13.

As the elastic polymeric substance forming the anisotropically conductive sheet body 11, is preferred a heat-resistant polymeric substance having a crosslinked structure. Various materials may be used as curable polymeric substance-forming materials usable for obtaining such crosslinked polymeric substances. Specific examples thereof include silicone rubber; conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block copolymer rubber and styrene-isoprene block copolymers, and hydrogenated products thereof; and chloroprene rubber, urethane rubber, polyester rubber, epichlorohydrin rubber, ethylene-propylene copolymer rubber, ethylene-propylene-diene copolymer rubber and soft liquid epoxy rubber.

Among these, silicone rubber is preferred from the viewpoints of molding and processing ability, electrical properties and adhesiveness to a DLC film 15, which will be described subsequently.

As the silicone rubber, is preferred that obtained by crosslinking or condensing liquid silicone rubber. The liquid silicone rubber may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reactions in the presence of dimethylvinylchlorosilane or dimethylvinylalkoxysilane and successively fractionating the reaction product by, for example, repeated dissolution-precipitation.

Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinylsiloxane as a polymerization terminator and suitably selecting other reaction conditions (for example, amounts of the cyclic siloxane and polymerization terminator). As the catalyst for the anionic polymerization in this process, may be used an alkali such as tetramethylammonium hydroxide or n-butylphosphonium hydroxide or a silanolate solution thereof. The reaction is conducted at a temperature of, for example, 80 to 130° C.

Such a vinyl group-containing dimethyl polysiloxane preferably has a molecular weight Mw (weight average molecular weight as determined in terms of standard polystyrene; the same shall apply hereinafter) of 10,000 to 40,000. It also preferably has a molecular weight distribution index (a ratio Mw/Mn of weight average molecular weight Mw as determined in terms of standard polystyrene to number average molecular weight Mn as determined in terms of standard polystyrene; the same shall apply hereinafter) of at most 2 from the viewpoint of the heat resistance of the resulting anisotropically conductive sheet 10.

On the other hand, hydroxyl group-containing liquid silicone rubber (hydroxyl group-containing dimethyl polysiloxane) is generally obtained by subjecting dimethyldichlorosilane or dimethyldialkoxysilane to hydrolysis and condensation reactions in the presence of dimethylhydrochlorosilane or dimethylhydroalkoxysilane and successively fractionating the reaction product by, for example, repeated dissolution-precipitation.

The hydroxyl group-containing liquid silicone rubber is also obtained by subjecting a cyclic siloxane to anionic polymerization in the presence of a catalyst, using, for example, dimethylhydrochlorosilane, methyldihydrochloroisilane or dimethylhydroalkoxysilane as a polymerization terminator and suitably selecting other reaction conditions (for example, amounts of the cyclic siloxane and polymerization terminator). As the catalyst for the anionic polymerization in this process, may be used an alkali such as tetramethylammonium hydroxide or n-butylphosphonium hydroxide or a silanolate solution thereof. The reaction is conducted at a temperature of, for example, 80 to 130° C.

Such a hydroxyl group-containing dimethyl polysiloxane preferably has a molecular weight Mw of 10,000 to 40,000. It also preferably has a molecular weight distribution index of at most 2 from the viewpoint of the heat resistance of the resulting anisotropically conductive sheet 10.

In the present invention, either one of the above-described vinyl group-containing dimethyl polysiloxane or hydroxyl group-containing dimethyl polysiloxane may be used, or both may also be used in combination.

When the anisotropically conductive sheet is used in a probe test or burn-in test as to integrated circuits formed on a wafer, a substance, which is a cured product (hereinafter referred to as "cured silicon rubber") of the addition type liquid silicone rubber, and has a compression set of at most 10%, more preferably at most 8%, still more preferably at most 6% at 150° C., is preferably used as the elastic polymeric substance. If the compression set exceeds 10%, the conductive parts 12 tend to cause permanent set when the resulting anisotropically conductive sheet is used repeatedly over many times or used repeatedly under a high-temperature environment, whereby a chain of the conductive particles in the conductive part 12 is disordered. As a result, it may be difficult in some cases to retain necessary conductivity.

In the present invention, the compression set of the cured silicone rubber can be measured by a method in accordance with JIS K 6249.

As the cured silicone rubber, is preferably used that having a durometer A hardness of 10 to 60, more preferably 15 to 60, particularly preferably 20 to 60 at 23° C. If the durometer A hardness is lower than 10, the insulating part 13 for mutually insulating the conductive parts 12 is easily over-distorted when pressurized, and it may be difficult in some cases to retain necessary insulating property between the conductive parts 12. If the durometer A hardness exceeds 60 on the other hand, pressurizing force by a considerably heavy load is required for giving proper distortion to the conductive parts 12 for connection, so that for example, an object of inspection tends to cause deformation or breakage.

Further, if that having a durometer A hardness outside the above range is used as the cured silicone rubber, the conductive parts 12 tend to cause permanent set when the resulting anisotropically conductive sheet is used repeatedly over many times, whereby a chain of the conductive particles in the conductive part 12 is disordered. As a result, it may be difficult in some cases to retain the necessary conductivity.

When the anisotropically conductive sheet is used in a burn-in test, the cured silicone rubber preferably has a durometer A hardness of 25 to 40 at 23° C.

If that having a durometer A hardness outside the above range is used as the cured silicone rubber, the conductive parts 12 tend to cause permanent set when the resulting anisotropically conductive sheet is used repeatedly in the burn-in test, whereby a chain of the conductive particles in the conductive part 12 is disordered. As a result, it may be difficult in some cases to retain necessary conductivity.

In the present invention, the durometer A hardness of the cured silicone rubber can be measured by a method in accordance with JIS K 6249.

Further, as the cured silicone rubber, is preferably used that having tear strength of at least 8 kN/m, more preferably at least 10 kN/m, still more preferably at least 15 kN/m, particularly preferably at least 20 kN/m at 23° C. If the tear strength is lower than 8 kN/m, the resulting anisotropically conductive sheet tends to deteriorate durability when it is distorted in excess.

In the present invention, the tear strength of the cured silicone rubber can be measured by a method in accordance with JIS K 6249.

Addition type liquid silicone rubber is that cured by a reaction of a vinyl group with an Si—H bond, and either of a one-pack type (one-component type) composed of polysiloxane having both vinyl group and Si—H bond and a two-pack type (two-component type) composed of polysiloxane having a vinyl group and polysiloxane having an Si—H bond may be used. However, addition type liquid silicone rubber of the two-pack type is preferably used.

As the addition type liquid silicone rubber, is preferably used that having a viscosity of 100 to 1,250 Pa·s, more preferably 150 to 800 Pa·s, particularly preferably 250 to 500 Pa·s at 23° C. If this viscosity is lower than 100 Pa·s, precipitation of the conductive particles in such addition type liquid silicone rubber is easy to occur in a molding material for obtaining the anisotropically conductive sheet, which will be described subsequently, so that good storage stability is not achieved. In addition, the conductive particles are not oriented so as to align in the thickness-wise direction of the molding material layer when a parallel magnetic field is applied to the molding material layer, so that it may be difficult in some cases to form chains of the conductive particles in a uniform state. If this viscosity exceeds 1,250 Pa·s on the other hand, the viscosity of the resulting molding material becomes too high, so that it may be difficult in some cases to form the molding material layer in the mold. In addition, the conductive particles are not sufficiently moved even when a parallel magnetic field is applied to the molding material layer. Therefore, it may be difficult in some cases to orient the conductive particles so as to align in the thickness-wise direction.

The viscosity of such addition type liquid silicone rubber can be measured by means of a Brookfield type viscometer.

A curing catalyst for curing the polymeric substance-forming material may be contained in the polymeric substance-forming material. As such a curing catalyst, may be used an organic peroxide, fatty acid azo compound, hydrosilylated catalyst or the like.

Specific examples of the organic peroxide used as the curing catalyst include benzoyl peroxide, bisdicyclobenzoyl peroxide, dicumyl peroxide and di-tert-butyl peroxide.

Specific examples of the fatty acid azo compound used as the curing catalyst include azobisisobutyronitrile.

Specific examples of that can be used as the catalyst for hydrosilylation reaction include publicly known catalysts such as platinic chloride and salts thereof, platinum-unsaturated group-containing siloxane complexes, vinylsiloxane-platinum complexes, complexes of platinum and 1,3-divinyltetramethyldisiloxane, complexes of triorganophosphine or phosphine and platinum, acetyl acetate platinum chelates, and cyclic diene-platinum complexes.

The amount of the curing catalyst used is suitably selected in view of the kind of the polymeric substance-forming material, the kind of the curing catalyst and other curing treatment conditions. However, it is generally 3 to 15 parts by weight per 100 parts by weight of the polymeric substance-forming material.

As the conductive particles P contained in the conductive parts 12 in the anisotropically conductive sheet body 11, those exhibiting magnetism are preferably used from the viewpoint of permitting easy movement of the conductive particles P in the molding material for forming the anisotropically conductive sheet body 11 by a process, which will be described subsequently. Specific examples of such conductive particles P exhibiting magnetism include particles of metals exhibiting magnetism, such as iron, nickel and cobalt, particles of alloys thereof and particles containing such a metal; particles obtained by using these particles as core particles and plating the surface of the core particles with a metal having good conductivity, such as gold, silver, palladium or rhodium; particles obtained by using particles of a non-magnetic metal, inorganic substance particles such as glass beads, or polymer particles as core particles and plating the surface of the core particles with a conductive magnetic material such as nickel or cobalt; and particles obtained by coating the core particles with both conductive magnetic material and metal having good conductivity.

Among these, particles obtained by using nickel particles as core particles and plating the surface thereof with a metal having good conductivity, such as gold or silver are preferably used.

No particular limitation is imposed on the means for coating the surfaces of the core particles with the conductive metal. However, the coating may be conducted by, for example, electroless plating.

When particles obtained by coating the surfaces of core particles with a conductive metal are used as the conductive particles P, a coating rate (proportion of coated area of the conductive metal to the surface area of the core particles) of the conductive metal on the surfaces of the particles is preferably at least 40%, more preferably at least 45%, particularly preferably 47 to 95% from the viewpoint of achieving good conductivity.

The coating amount of the conductive metal is preferably 2.5 to 50% by weight, more preferably 3 to 30% by weight, still more preferably 3.5 to 25% by weight, particularly preferably 4 to 20% by weight based on the core particles. When the conductive metal used for the coating is gold, the coating amount is preferably 3 to 30% by weight, more preferably 3.5 to 25% by weight, still more preferably 4 to 20% by weight, particularly preferably 4.5 to 10% by weight based on the core particles. When the conductive metal used for the coating is silver, the coating amount is preferably 3 to 30% by weight, more preferably 4 to 25% by weight, still more preferably 5 to 23% by weight, particularly preferably 6 to 20% by weight based on the core particles.

The particle diameter of the conductive particles P is preferably 1 to 500 μm, more preferably 2 to 400 μm, still more preferably 5 to 300 μm, particularly preferably 10 to 150 μm.

The particle diameter distribution (Dw/Dn) of the conductive particles P is preferably 1 to 10, more preferably 1 to 7, still more preferably 1 to 5, particularly preferably 1 to 4.

When conductive particle P satisfying such conditions are used, the resulting anisotropically conductive sheet body 11 become easy to deform under pressure, and sufficient electrical contact is achieved among the conductive particles P in the conductive parts 12 of the anisotropically conductive sheet body 11.

No particular limitation is imposed on the shape of the conductive particles P. However, they are preferably in the shape of a sphere or star, or a mass of secondary particles obtained by aggregating these particles from the viewpoint of permitting easy dispersion of the conductive particles in the polymeric substance-forming material.

The water content in the conductive particles P is preferably at most 5%, more preferably at most 3%, still more preferably at most 2%, particularly preferably at most 1%. The use of conductive particles P satisfying such conditions prevents or inhibits occurrence of bubbles in the molding material layer when the molding material layer is subjected to a curing treatment in a production process, which will be described subsequently.

A proportion of the conductive particles P contented in the conductive parts 12 is preferably 10 to 60%, more preferably 15 to 50% in terms of volume fraction. If this proportion is lower than 10%, it may be impossible in some cased to obtain conductive parts 12 sufficiently low in electric resistance value. If this proportion exceeds 60% on the other hand, the resulting conductive parts 12 are liable to be brittle, so that elasticity required of the conductive parts 12 may not be achieved in some cases.

In the polymeric substance-forming material, as needed, may be contained an ordinary inorganic filler such as silica powder, colloidal silica, aerogel silica or alumina. By containing such an inorganic filler, the thixotropic property of the resulting molding material is ensured, the viscosity thereof becomes high, the dispersion stability of the conductive particles P is improved, and moreover the strength of the anisotropically conductive sheet 10 obtained by conducting the curing treatment can be made high.

No particular limitation is imposed on the amount of such an inorganic filler used. However, the use in a too great amount is not preferred because the movement of the conductive particles P by a magnetic field in the production process, which will be described subsequently, is greatly impeded.

A DLC film 15 is formed on the surface of such an anisotropically conductive sheet body 11. In the embodiment illustrated, the DLC film 15 is formed so as to cover the whole surface of the anisotropically conductive sheet body 11.

The thickness of the DLC film 15 is preferably 1 to 500 nm, more preferably 2 to 50 nm. If this thickness is smaller than 1 nm, such a DLC film 15 may be formed in an island form on the anisotropically conductive sheet body 11 in some cases, so that it is difficult to form the DLC film 15 so as to cover at least the whole surface of the insulating part in the anisotropically conductive sheet body 11. If this thickness exceeds 500 nm on the other hand, an electric resistance value between conductive parts 12 in the anisotropically conductive sheet body 11 may be lowered by such a DLC film 15 to cause electrical leak between the conductive parts 12 in some cases.

The DLC film 15 preferably has a surface resistivity of $1\times10^8$ to $1\times10^{14}$ Ω/□, more preferably $1\times10^{10}$ to $1\times10^{12}$ Ω/□. If this surface resistivity is lower than $1\times10^8$ Ω/□, necessary insulating property between adjacent conductive parts 12 in the anisotropically conductive sheet body 11 may not be achieved in some cases. If this surface resistivity exceeds $1\times10^{14}$ Ω/□ on the other hand, it is difficult to inhibit the accumulation of electric charge on the surface thereof.

In the DLC film 15, a ratio of a diamond bond to a graphite bond is preferably from 9:1 to 5:5, more preferably from 8:2 to 6:4, whereby a DLC film 15 having a surface resistivity within the above-described range is surely obtained.

Such an anisotropically conductive sheet can be produced in the following manner.

Figure 2:
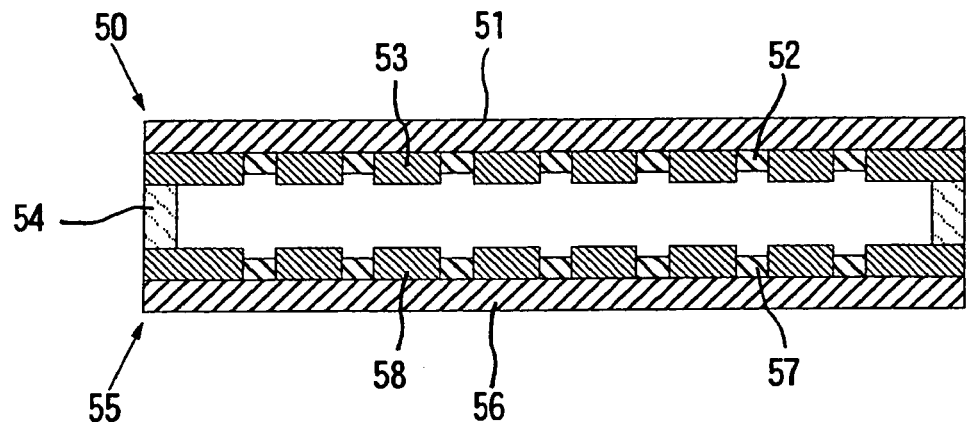
FIG. 2 is a cross-sectional view illustrating the construction of an exemplary mold used for producing an anisotropically conductive sheet body.

FIG. 2 is a cross-sectional view illustrating the construction of an exemplary mold used for producing an anisotropically conductive sheet body 11. This mold is so constructed that a top force 50 and a bottom force 55 making a pair therewith are arranged so as to be opposed to each other through a frame-like spacer 54, and a cavity is formed between a lower surface of the top force 50 and an upper surface of the bottom force 55.

In the top force 50, ferromagnetic substance layers 52 are formed on a lower surface of a ferromagnetic base plate 51 in accordance with a pattern antipodal to an arrangement pattern of conductive parts 12 of an anisotropically conductive sheet body 11 to be produced, and non-magnetic substance layers 53 having a thickness greater than that of the ferromagnetic substance layers 52 are formed at other portions than the ferromagnetic substance layers 52.

In the bottom force 55 on the other hand, ferromagnetic substance layers 57 are formed on an upper surface of a ferromagnetic base plate 56 in accordance with the same pattern as the arrangement pattern of the conductive parts 12 of the anisotropically conductive sheet body 11 to be produced, and non-magnetic substance layers 58 having a thickness greater than that of the ferromagnetic substance layers 57 are formed at other portions than the ferromagnetic substance layers 57.

As a material for forming the ferromagnetic base plates 51 and 56 in both top force 50 and bottom force 55, may be used a ferromagnetic metal such as iron, iron-nickel alloy, iron-cobalt alloy, nickel or cobalt. The ferromagnetic base plates 51, 56 preferably have a thickness of 0.1 to 50 mm, and are preferably smooth and subjected to a chemical degreasing treatment, and further subjected to a mechanical polishing treatment at surfaces thereof.

As a material for forming the ferromagnetic substance layers 52 and 57 in both top force 50 and bottom force 55, may be used a ferromagnetic metal such as iron, iron-nickel alloy, iron-cobalt alloy, nickel or cobalt. The ferromagnetic substance layers 52, 57 preferably have a thickness of at least 10 μm. If this thickness is smaller than 10 μm, it is difficult to apply a magnetic field having a sufficient intensity distribution to a molding material layer to be formed in the mold. As a result, it is difficult to gather conductive particles at a high density at portions to form conductive parts in the molding material layer, and so a sheet having good anisotropical conductivity may not be provided in some cases.

As a material for forming the non-magnetic substance layers 53 and 58 in both top force 50 and bottom force 55, may be used a non-magnetic metal such as copper, a polymeric substance having heat resistance, or the like. However, a polymeric substance cured by radiation is preferably used in that the non-magnetic substance layers 53, 58 can be easily formed by a technique of photolithography. As a material thereof, may be used, for example, a photoresist such as an acrylic type dry film resist, epoxy type liquid resist or polyimide type liquid resist.

The thickness of the non-magnetic substance layers 53 and 58 is preset according to the thickness of the ferromagnetic substance layers 52, 57 and projected height of the conductive parts 12 in the intended anisotropically conductive sheet body 11.

The anisotropically conductive sheet body 11 is produced in the following manner using the above-described mold.

Figure 3:
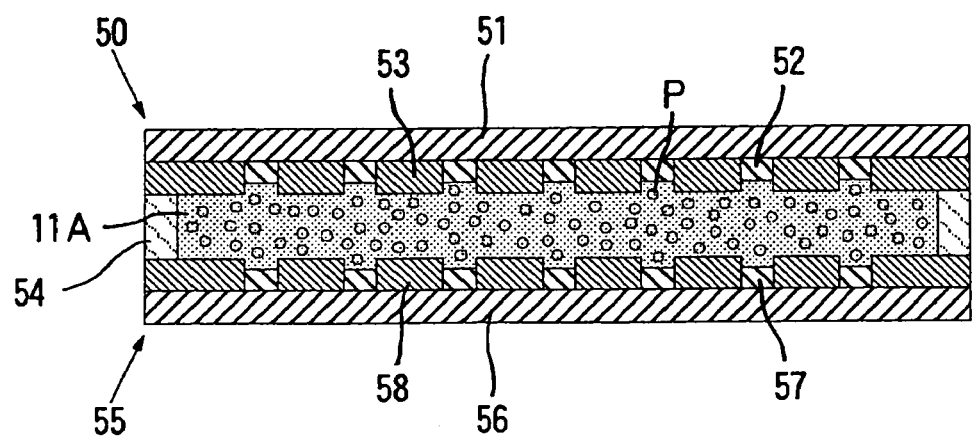
FIG. 3 is a cross-sectional view illustrating a state that a molding material layer for the anisotropically conductive sheet body has been formed in the mold shown in FIG. 2.

A flowable molding material with conductive particles exhibiting magnetism dispersed in a polymeric substance-forming material such as liquid silicone rubber, which will become an elastic polymeric substance by being cured, is first prepared, and the molding material is filled into the cavity in the mold as illustrated in FIG. 3, thereby forming a molding material layer 11A. At this time, the conductive particles P are contained in a state dispersed in the molding material layer 11A.

Figure 4:
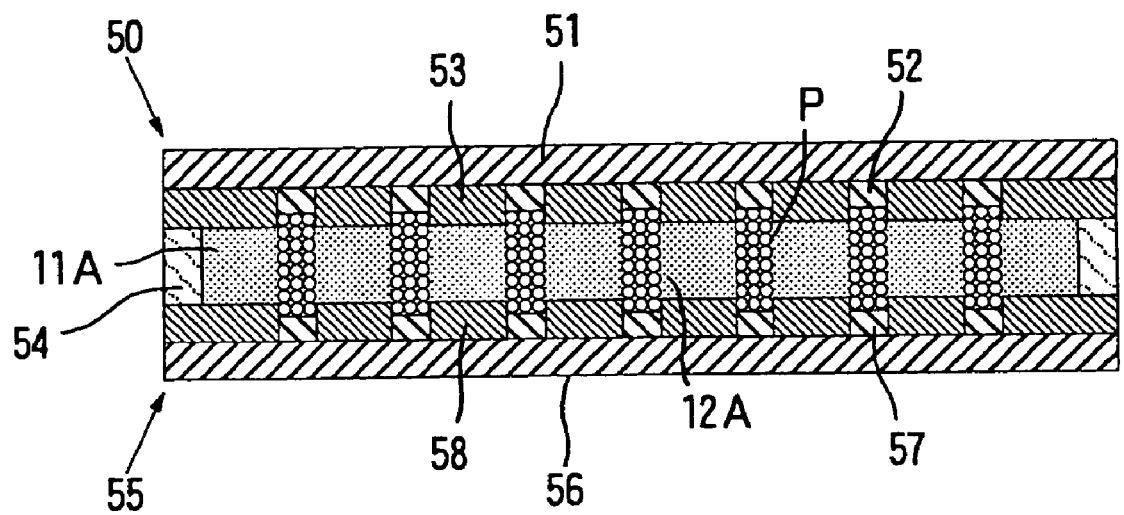
FIG. 4 is a cross-sectional view illustrating a state that conductive particles in the molding material layer have been gathered at portions to become conductive parts in the molding material layer.

A pair of, for example, electromagnets are then arranged on an upper surface of the ferromagnetic base plate 51 in the top force 50 and a lower surface of the ferromagnetic base plate 56 in the bottom force 55, and the electromagnets are operated, thereby applying a parallel magnetic field having an intensity distribution, i.e., a parallel magnetic field having higher intensity between the ferromagnetic substance layers 52 in the top force 50 and their corresponding ferromagnetic substance layers 57 in the bottom force 55, to the molding material layer 11A in the thickness-wise direction thereof. As a result, in the molding material layer 11A, as illustrated in FIG. 4, the conductive particles P dispersed in the molding material layer 11A are gathered at portions 12A to become the conductive parts, which are located between the ferromagnetic substance layers 52 in the top force 50 and their corresponding ferromagnetic substance layers 57 in the bottom force 55, and at the same time oriented so as to align in the thickness-wise direction of the molding material layer.

Figure 5:
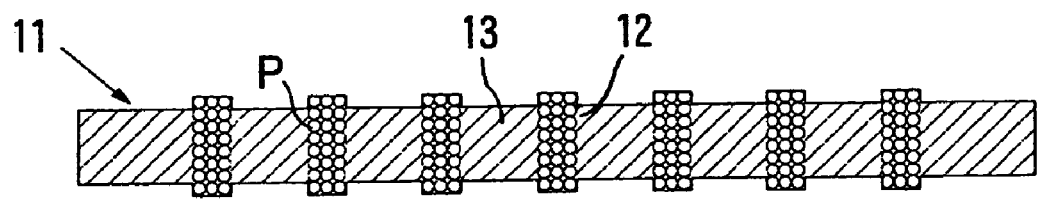
FIG. 5 is a cross-sectional view illustrating the construction of an anisotropically conductive sheet body.

In this state, the molding material layer 11A is subjected to a curing treatment, thereby producing an anisotropically conductive sheet body 11 formed by an elastic polymeric substance as a whole and comprising, as illustrated in FIG. 5, conductive parts 12, in which the conductive particles P are filled at a high density, and an insulating part 13, in which the conductive particles P are not present at all or scarcely present.

In the above-described process, the curing treatment of the molding material layer 11A may be conducted in the state that the parallel magnetic field has been applied. However, the treatment may also be conducted after stopping the application of the parallel magnetic field.

The intensity of the parallel magnetic field applied to the molding material layer 11A is an intensity that it amounts to 0.2 to 2 T on the average.

As a means for applying the parallel magnetic field to the molding material layer 11A, permanent magnets may also be used in place of the electromagnets. As such permanent magnets, those composed of alunico (Fe—Al—Ni—Co alloy), ferrite or the like are preferred in that the intensity of the parallel magnetic field within the above range is achieved.

The curing treatment of the molding material layer 11A is suitably selected according to the materials used. However, the treatment is generally conducted by a heat treatment. Specific heating temperature and heating time are suitably selected in view of the kind of the polymeric substance-forming material forming the molding material layer 11A, the time required for movement of the conductive particles P, and the like.

A surface (the whole surface in this embodiment) to form the DLC film in the resultant anisotropically conductive sheet body 11 is then subjected to, preferably, an ion etching treatment.

As a gas ion used in the ion etching treatment, may be used an argon ion or the like.

The treatment time of the ion etching treatment is 5 to 20 minutes.

A DLC film is then formed on the surface subjected to the ion etching treatment in the anisotropically conductive sheet body 11, thereby obtaining an anisotropically conductive sheet 10 of the construction illustrated in FIG. 1.

As a method for forming the DLC film, may be utilized a PVD method, plasma CVD method or the like. However, the PVD method is preferred in that a DLC film having a necessary thickness can be formed at a comparatively low temperature, whereby it can be avoided to adversely affect the properties of the anisotropically conductive sheet body 11 in the formation of the DLC film.

As the PVD method for forming the DLC film, may be utilized various methods using a solid carbon source, for example, a sputtering method, an electron beam vapor deposition method, an arc discharge method using a solid carbon source as a cathode, and the like. As the solid carbon source, may be used graphite or the like.

Specific conditions in the PVD method are suitably preset according to the thickness of a DLC film to be formed, the chemical structure of the DLC film, etc. However, the treating temperature is preferably at most 150° C., more preferably 60 to 120° C. By presetting such temperature conditions, the DLC film having the necessary thickness can be formed without adversely affecting the properties of the anisotropically conductive sheet body 11.

According to the anisotropically conductive sheet 10 described above, the DLC film 15 is formed on the whole surface of the anisotropically conductive sheet body 11, thereby preventing a low-molecular weight component in the elastic polymeric substance forming the anisotropically conductive sheet body 11 from bleeding out to the surface of the anisotropically conductive sheet 10. Therefore, the anisotropically conductive sheet can prevent an object of connection from being contaminated with the low-molecular weight component, and moreover it can be prevented from adhering to the object of connection even when it is left to stand for a long period of time in a state pressurized by the object of connection under a high-temperature environment.

In addition, since the surface resistivity of the DLC film 15 is low compared with that of the elastic polymeric substance, the DLC film can be prevented or inhibited from accumulating electric charge on the surface thereof.

Since the DLC film 15 is formed so as to cover the surfaces of the conductive parts 12, whereby the surface hardness of portions coming into contact with electrodes to be connected becomes high, high conductivity is achieved by small pressurizing force as apparent from Examples, which will be described subsequently.

Figure 6:
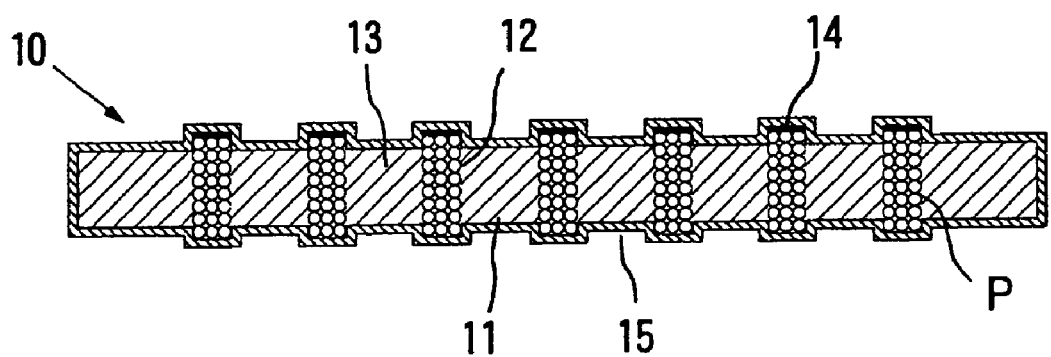
FIG. 6 is a cross-sectional view illustrating the construction of another exemplary anisotropically conductive sheet according to the present invention.

FIG. 6 is a cross-sectional view illustrating the construction of another exemplary anisotropically conductive sheet according to the present invention. In this anisotropically conductive sheet 10, a metal layer 14 is integrally formed on one surface of an anisotropically conductive sheet body 11 so as to cover conductive parts 12, and a DLC film 15 is formed so as to cover the whole surface of the anisotropically conductive sheet body 11 and the metal layer 14. The constructions of the anisotropically conductive sheet body 11 and DLC film 15 are basically the same as those of the anisotropically conductive sheet body 11 and DLC film 15 in the anisotropically conductive sheet 10 shown in FIG. 1.

As a material for forming the metal layer 14, may be used titanium, rhodium, iridium, tungsten, nickel or the like. When electrodes in an object of connection coming into direct contact with the anisotropically conductive sheet 10 are formed by solder, titanium, rhodium or tungsten is preferably used from the viewpoint of preventing adhesion of the solder and migration by the solder.

The thickness of the metal layer 14 is preferably 5 to 1,000 nm, more preferably 10 to 100 nm. If this thickness is smaller than 5 nm, it is difficult to form the metal layer 14 in an even thickness, so that difficulty is encountered on the stable formation of the metal layer 14. If the thickness exceeds 1,000 nm on the other hand, the metal layer 14 tends to be broken or separated with the increase of deposition stress.

The surface resistivity of the metal layer 14 is preferably at most $1 \times 10^{-2}$ $\Omega/\square$, more preferably at most $1 \times 10^{-3}$ $\Omega/\square$. If the surface resistivity of the metal layer 14 exceeds $1 \times 10^2$ $\Omega/\square$, a contact resistance of the resulting anisotropically conductive sheet 10 increases, so that it may incur deterioration of its performance as a contact probe in some cases.

The anisotropically conductive sheet 10 described above can be produced in the same manner as in the anisotropically conductive sheet 10 shown in FIG. 1 except for the formation of the metal layer 14.

The metal layer 14 can be formed, for example, in the following manner.

Figure 7:
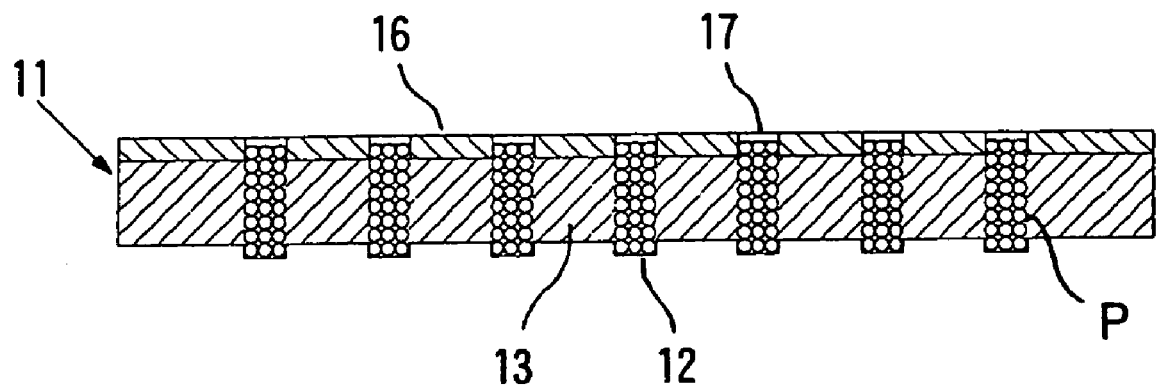
FIG. 7 is a cross-sectional view illustrating a state that a mask has been arranged on one surface of the anisotropically conductive sheet body.

A plate-like mask 16, in which openings 17 have been formed in accordance with a pattern corresponding to a pattern of the conductive parts 12 in the anisotropically conductive sheet body 11 as illustrated in FIG. 7, is first provided. This mask 16 is arranged on one surface of the anisotropically conductive sheet body 11 in such a manner that the openings 17 in the mask 16 are respectively located on their corresponding conductive parts 12.

As a material for forming the mask 16, may be used a metallic material such as stainless steel or a resin material. As a method for forming the openings 17 in the mask 16, may be utilized a method by etching, machining, laser beam machining or the like.

Figure 8:
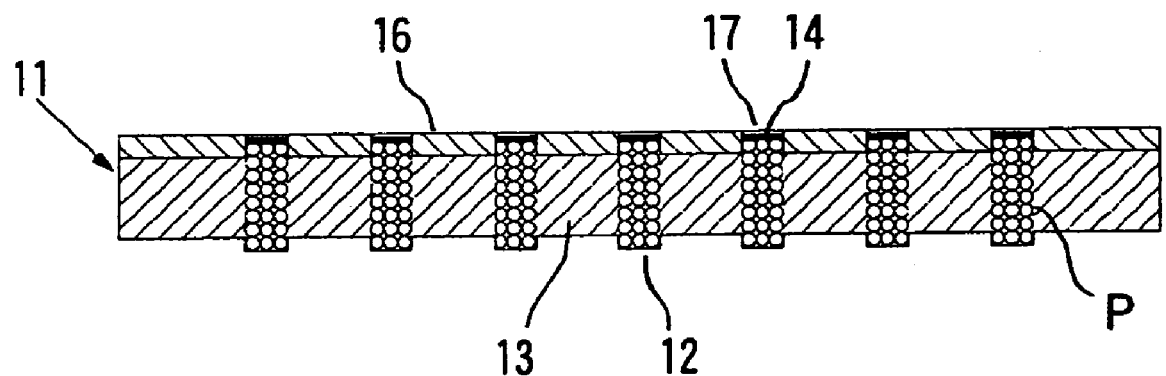
FIG. 8 is a cross-sectional view illustrating a state that a metal layer has been formed on surfaces of conductive parts of the anisotropically conductive sheet body.
Figure 9:
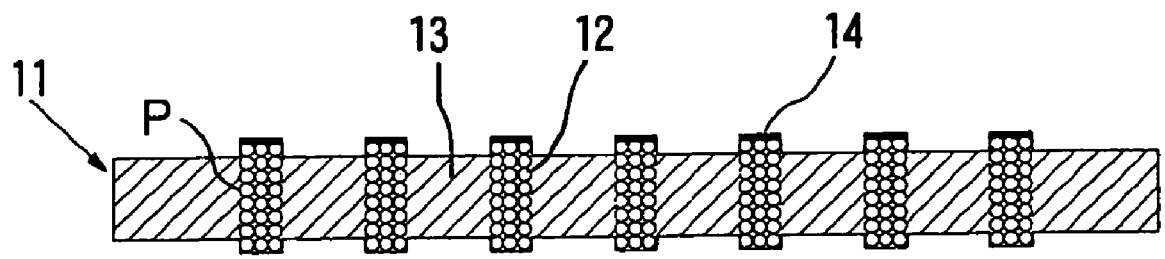
FIG. 9 is a cross-sectional view illustrating the construction of the anisotropically conductive sheet body, on the surfaces of conductive parts of which a metal layer has been formed.

The surfaces of the conductive parts 12 in the anisotropically conductive sheet body 11 are then subjected to an ion etching treatment through the openings 17 in the mask 16. A metal layer 14 is then formed on the surfaces of the conductive parts 12 in the anisotropically conductive sheet body 11 through the openings 17 in the mask 16 as illustrated in FIG. 8. The mask 16 is then removed from the one surface of the anisotropically conductive sheet body 11, thereby obtaining an anisotropically conductive sheet body 11, in which the metal layer 14 has been formed so as to cover one surface of each of the conductive parts 12 as illustrated in FIG. 9.

As a method for forming the metal layer 14, may be utilized a method such as an arc discharge method using an electrode composed of a metallic material forming the metal layer 14 as a cathode or a sputtering method.

After the whole surface of the anisotropically conductive sheet body 11 including the metal layer 14 is then subjected to an ion etching treatment, a DLC film is formed by the PVD method to obtain the anisotropically conductive sheet 10 shown in FIG. 6.

According to the anisotropically conductive sheet 10 of the construction shown in FIG. 6, the same effects as those in the anisotropically conductive sheet of the construction shown in FIG. 1 are achieved, and the following additional effects are brought about.

More specifically, the metal layer 14 is formed on the surfaces of the conductive parts 12 in the anisotropically conductive sheet body 11, so that a contact resistance to electrodes to be connected becomes low. Further, in the conductive part 12, a plurality of conductive paths are formed by a chain of the conductive particles P, and the respective conductive paths are short-circuited by the metal layer 14, so that all the conductive paths formed in the conductive part 12 are effectively utilized as far as electrodes to be connected are electrically connected to the metal layer 14. Therefore, lowering of conductivity due to positional deviation between the electrodes to be connected and the conductive parts 12 is inhibited. Accordingly, high reliability on connection is achieved to an object of connection.

In addition, since the conductive parts 12 are protected by the metal layer 14, the anisotropically conductive sheet 10 with high durability in repeated use is provided.

The anisotropically conductive sheets according to the present invention are not limited to the above-described embodiments, and various changes may be added thereto.

For example, it is not essential that the conductive parts 12 are protruded from both surfaces of the insulating part 13, and both surfaces may be flat, or the conductive parts 12 may be protruded from only one surface of the insulating part 13.

Conductive parts for non-connection that are not electrically connected to electrodes of an object of connection may also be formed in the anisotropically conductive sheet body 11, in addition to the conductive parts 12 that are electrically connected to the electrodes.

Further, the DLC film 15 may be formed only on one surface, or may be formed only on one surface or both surfaces of the insulating part.

[Anisotropically Conductive Connector]

Figure 10:
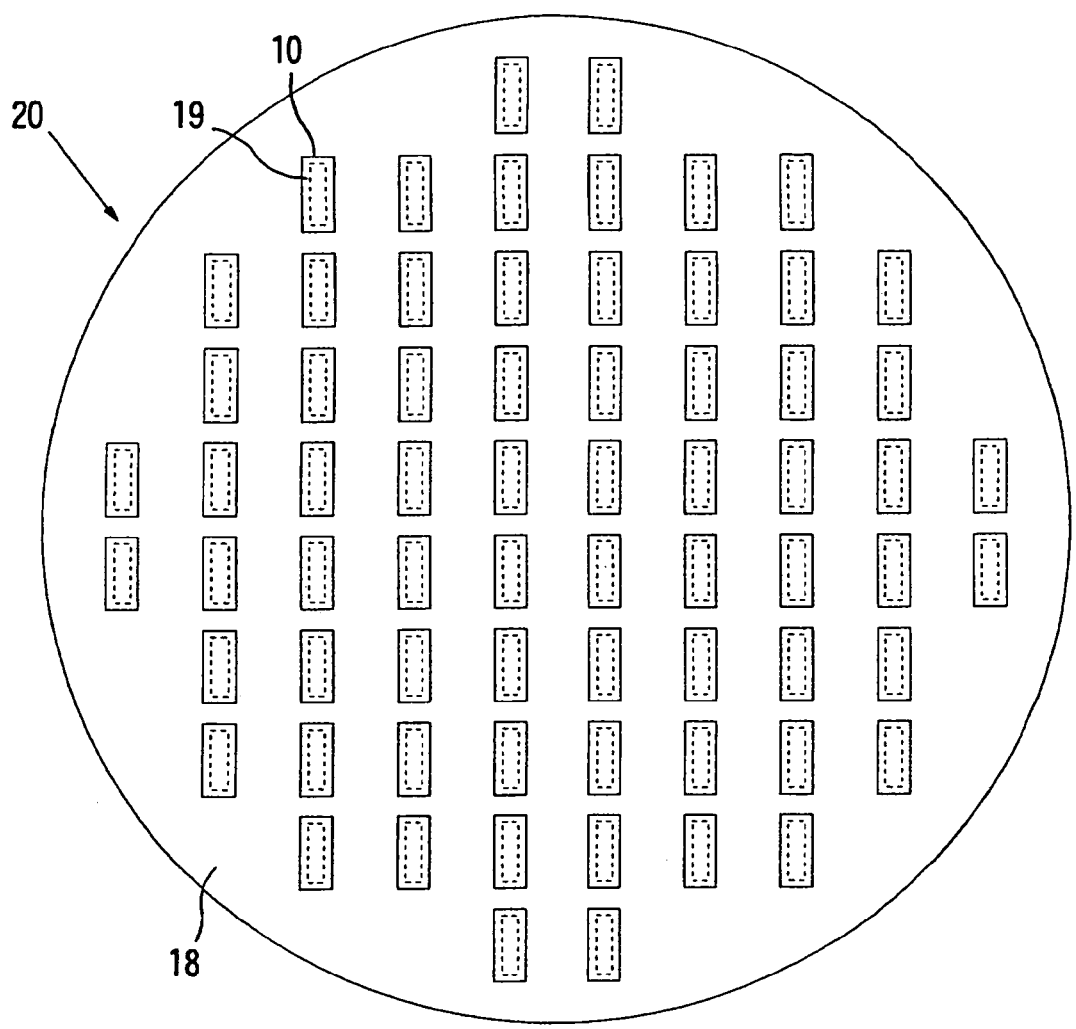
FIG. 10 is a plan view illustrating an exemplary anisotropically conductive connector according to the present invention.
Figure 11:
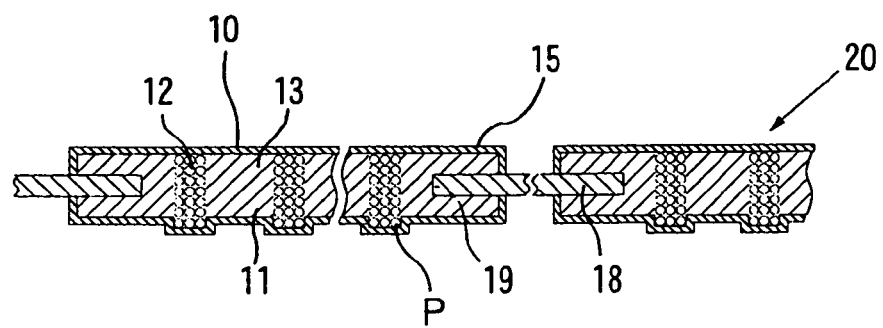
FIG. 11 is a cross-sectional view illustrating, on an enlarged scale, a principal part of the anisotropically conductive connector shown in FIG. 10.

FIG. 10 is a plan view illustrating an exemplary anisotropically conductive connector according to the present invention, and FIG. 11 is a cross-sectional view illustrating, on an enlarged scale, a principal part of the anisotropically conductive connector shown in FIG. 10.

This anisotropically conductive connector 20 is suitable for use in conducting electrical inspection of each of a plurality of integrated circuits formed on a wafer in a state of the wafer, and has a frame plate 18, in which a plurality of openings 19 have been formed correspondingly to regions, in which electrodes to be inspected have been arranged, in all the integrated circuits formed on the wafer, which is an object of inspection. The anisotropically conductive sheet 10 is arranged in each of the openings 19 in the frame plate 18 so as to close the opening 19, and a peripheral edge of the anisotropically conductive sheet 10 is supported by each opening edge of the frame plate 18.

The construction of each of the anisotropically conductive sheets 10 in this embodiment is basically the same as that of the anisotropically conductive sheet 10 shown in FIG. 1 except that one surface (upper surface in FIG. 11) coming into contact with a wafer, which is an object of inspection, is made flat, namely, the conductive parts 12 in the anisotropically conductive sheet body 11 are not protruded at one surfaces thereof.

As a material for forming the frame plate 18 in the anisotropically conductive connector 20, may be used various kinds of materials such as metallic materials, ceramic materials and resin materials. Specific examples thereof include metallic materials such as metals such as iron, copper, nickel, chromium, cobalt, magnesium, manganese, molybdenum, indium, lead, palladium, titanium, tungsten, aluminum, gold, platinum and silver, and alloys or alloy steels composed of a combination of at least two of these metals; ceramic materials such as silicon nitride, silicon carbide and alumina; and resin materials such as aramid nonwoven fabric-reinforced epoxy resins, aramid nonwoven fabric-reinforced polyimide resins and aramid nonwoven fabric-reinforced bismaleimidotriazine resins.

When the anisotropically conductive connector 20 is used in the burn-in test, it is preferable to use a material having a coefficient of linear thermal expansion equivalent or close to that of a material forming a wafer, which is an object of inspection, as a material forming the frame plate 18. More specifically, when the material forming the wafer is silicon, that having a coefficient of linear thermal expansion of at most $1.5 \times 10^{-4}$/K, particularly, $3 \times 10^{-6}$ to $8 \times 10^{-6}$/K is preferably used. Specific examples thereof include metallic materials such as invar alloys such as invar, Elinvar alloys such as Elinvar, superinvar, covar, and 42 alloy; and aramid nonwoven fabric-reinforced organic resin materials.

No particular limitation is imposed on the thickness of the frame plate 18 so far as its form is retained, and the anisotropically conductive sheets 10 can be held. However, the thickness is, for example, 0.03 to 1 mm, preferably 0.05 to 0.25 mm.

Such an anisotropically conductive connector 20 can be produced, for example, in the following manner.

A frame plate 18, in which a plurality of openings 19 have been formed correspondingly to electrode regions, in which electrodes to be inspected have been arranged, in all integrated circuits formed on a wafer that is an object of inspection is first produced. As a method for forming the openings 19 in the frame plate 18, may be utilized, for example, an etching method or the like.

Figure 12:
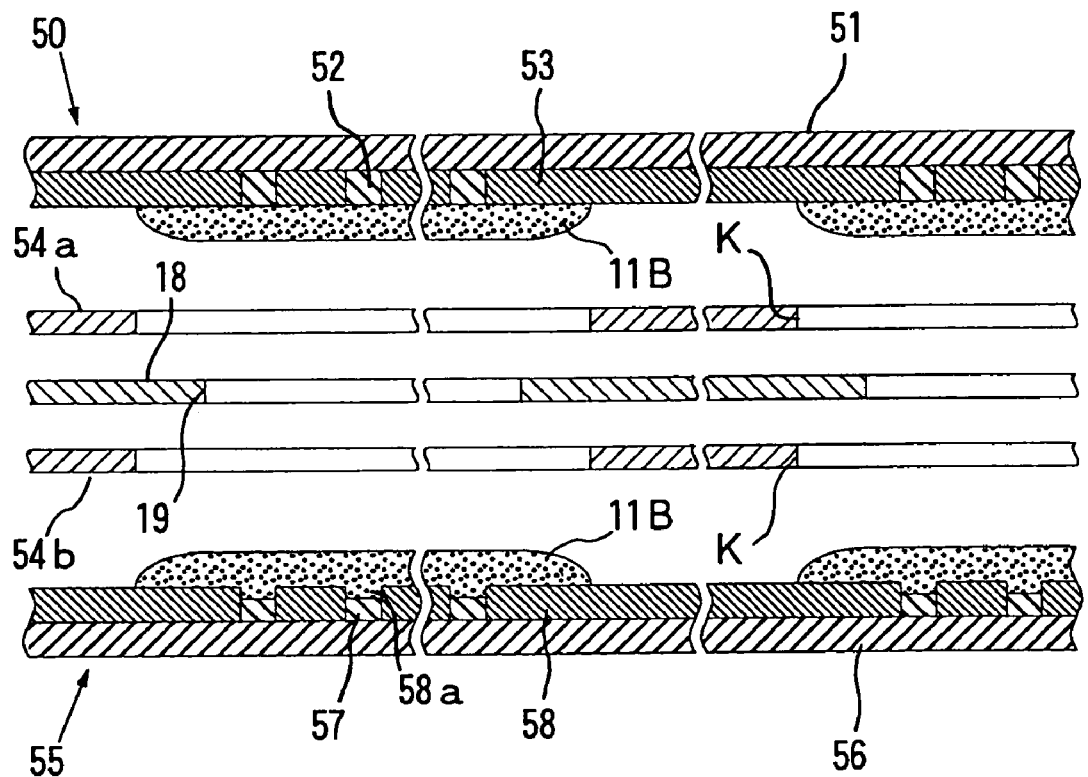
FIG. 12 is a cross-sectional view illustrating a state that a frame plate has been arranged through spacers between a top force and a bottom force in a mold for molding anisotropically conductive sheet bodies.

A molding material with conductive particles exhibiting magnetism dispersed in a polymeric substance-forming material, which will become an elastic polymeric substance by being cured, is then prepared. As illustrated in FIG. 12, a mold for molding anisotropically conductive sheet bodies is provided, and the molding material prepared is applied to the molding surfaces of each of a top force 50 and a bottom force 55 in this mold in accordance with a necessary pattern, namely, an arrangement pattern of anisotropically conductive sheets 10 to be formed, thereby forming molding material layers 11B. As a method for applying the molding material to the molding surfaces of the top force 50 and bottom force 55, is preferably used a screen printing method. According to such a method, the molding material can be easily applied according to the necessary pattern, and a proper amount of the molding material can be applied.

The mold will be described specifically. In the top force 50, ferromagnetic substance layers 52 are formed on a lower surface of a ferromagnetic base plate 51 in accordance with a pattern antipodal to an arrangement pattern of conductive parts 12 in all anisotropically conductive sheet bodies 11 to be molded, and non-magnetic substance layers 53 are formed at other portions than the ferromagnetic substance layers 52. The molding surface is formed by these ferromagnetic substance layers 52 and non-magnetic substance layers 53.

In the bottom force 55 on the other hand, ferromagnetic substance layers 57 are formed on an upper surface of a ferromagnetic base plate 56 in accordance with the same pattern as the arrangement pattern of the conductive parts 12 in all the anisotropically conductive sheet bodies 11 to be molded, and non-magnetic substance layers 58 are formed at other portions than the ferromagnetic substance layers 57. The molding surface is formed by these ferromagnetic substance layers 57 and non-magnetic substance layers 58. Recessed parts 58a are formed in the molding surface of the bottom force 55 corresponding to the projected parts at the other surfaces of the anisotropically conductive sheet bodies to be molded.

Materials of the ferromagnetic base plates 51, 56, ferromagnetic substance layers 52, 57 and non-magnetic substance layers 53, 58, and other conditions are the same as those of the above-described mold shown in FIG. 2.

Figure 13:
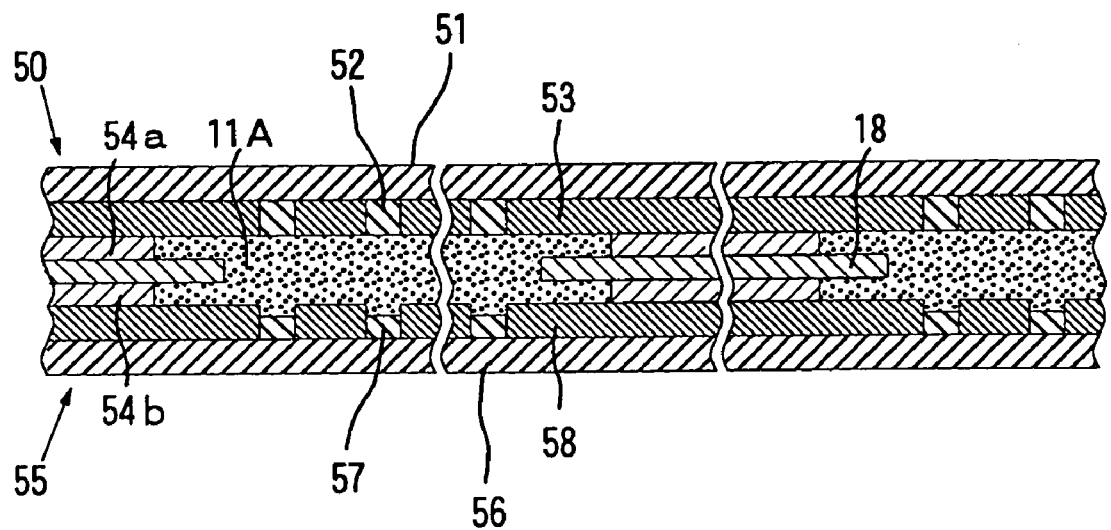
FIG. 13 is a cross-sectional view illustrating a state that molding material layers of the intended form have been formed between the top force and the bottom force in the mold.

The frame plate 18 is then arranged in alignment on the molding surface of the bottom force 55, on which the molding material layers 11B have been formed, through a spacer 54b, in which a plurality of openings K each having a shape corresponding to a plane shape of the anisotropically conductive sheet bodies 11 to be formed have been formed, and on the frame plate 18, the top force 50, on which the molding material layers 11B have been formed, is arranged in alignment through a spacer 54a, in which a plurality of openings K each having a shape corresponding to a plane shape of the anisotropically conductive sheet bodies 11 to be formed have been formed. Further, these top and bottom forces are superimposed on each other, whereby molding material layers 11A of the intended form (form of the anisotropically conductive sheet bodies 11 to be formed) are formed between the top force 50 and the bottom force 55 as illustrated in FIG. 13.

As described above, the spacers 54a and 54b are arranged between the frame plate 18 and, the top force 50 and the bottom force 55, respectively, whereby the anisotropically conductive sheet bodies of the intended form can be formed, and adjacent anisotropically conductive sheet bodies are prevented from being connected to each other, so that a great number of anisotropically conductive sheet bodies independent of one another can be formed with certainty.

Figure 14:
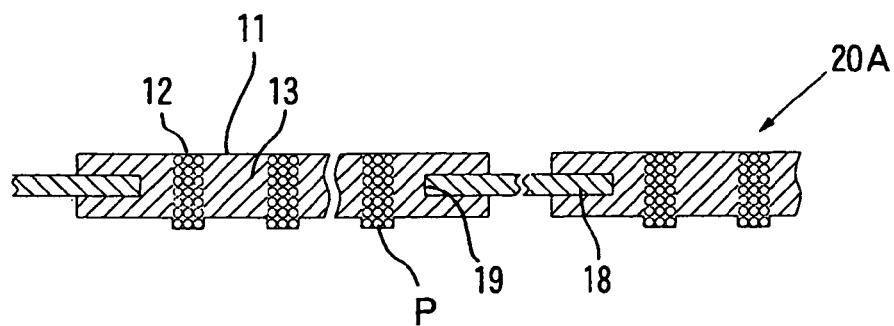
FIG. 14 is a cross-sectional view illustrating the construction of a principal part of an intermediate for connector.

A pair of, for example, electromagnets are then arranged on an upper surface of the ferromagnetic base plate 51 in the top force 50 and a lower surface of the ferromagnetic base plate 56 in the bottom force 55, and the electromagnets are operated, whereby the conductive particles dispersed in the molding material layers 11A are gathered at portions to become the conductive parts 12, which are located between the ferromagnetic substance layers 52 of the top force 50 and their corresponding ferromagnetic substance layers 57 of the bottom force 55, and oriented so as to align in the thickness-wise direction of the molding material layers. In this state, the molding material layers 11A are subjected to a curing treatment, whereby a plurality of anisotropically conductive sheet bodies 11, in each of which a plurality of conductive parts 12 with the conductive particles contained in the elastic polymeric substance in a state oriented so as to align in the thickness-wise direction are arranged in a state mutually insulated by an insulating part 13 composed of the elastic polymeric substance, in which the conductive particles are not present at all or scarcely present, are formed in a state fixed to the respective opening edges of the frame plate 18, thereby producing an intermediate 20A for connector composed of the frame plate 18 having the plurality of the openings 19 corresponding to regions, in which electrodes to be inspected have been arranged, in all integrated circuits formed on a wafer, which is an object of inspection, and the plurality of the anisotropically conductive sheet bodies 11 arranged so as to close the respective openings 19 in this frame plate 18 and supported by the respective opening edges of the frame plate 18 as illustrated in FIG. 14.

Thereafter, a DLC film is formed on each of the surfaces of the anisotropically conductive sheet bodies 11 in the intermediate 20A for connector, thereby obtaining the anisotropically conductive connector 20 shown in FIGS. 10 and 11.

According to such an anisotropically conductive connector 20, since the connector has the anisotropically conductive sheets 10, in which the DLC film 15 has been formed, the effects brought about by the above-described anisotropically conductive sheets 10 are achieved, and moreover the following additional effects are brought about.

More specifically, according to the anisotropically conductive connector 20, the anisotropically conductive sheets 10 are hard to be deformed and easy to handle because they are fixed to the frame plate 18, whereby the positioning and the holding and fixing to a wafer, which is an object of inspection, can be easily conducted in an electrically connecting operation to the wafer.

In addition, since each of the openings 19 in the frame plate 18 is formed correspondingly to the electrode regions, in which electrodes to be inspected have been arranged, of all integrated circuits formed on a wafer, which is an object of inspection, and the anisotropically conductive sheet 10 arranged in each of the openings 19 may be small in area, the individual anisotropically conductive sheets 10 are easy to be formed. Further, since the anisotropically conductive sheet 10 small in area is little in the absolute quantity of thermal expansion in a plane direction of the anisotropically conductive sheet 10 even when it is subjected to thermal hysteresis, the thermal expansion of the anisotropically conductive sheet 10 in the plane direction is surely restrained by the frame plate 18 by using a material having a low coefficient of linear thermal expansion as that for forming the frame plate 18. Accordingly, a good electrically connected state can be stably retained even when an object of inspection is a great number of integrated circuits formed on a large-area wafer, and the burn-in test is collectively performed on these integrated circuits.

The anisotropically conductive connectors according to the present invention are not limited to the above-described embodiment, and various changes may be added thereto.

An exemplary embodiment may be such that a plurality of openings are formed in the frame plate corresponding to regions, in which electrodes to be inspected have been arranged, in a plurality of integrated circuits selected from among integrated circuits formed on a wafer, which is an object of inspection, and a plurality of anisotropically conductive sheets are respectively arranged so as to close these openings. The number of the integrated circuits selected is suitably selected in view of the size of the wafer, the number of the integrated circuits formed on the wafer, the number of electrodes to be inspected in each integrated circuit, and the like, and is, for example, 16, 32, 64 or 128.

Another exemplary embodiment may be such that a single opening is formed in the frame plate, and a single anisotropically conductive sheet is arranged so as to close the opening.

[Circuit Inspection Apparatus]

The circuit inspection apparatus according to the present invention will hereinafter be described taking, as an example, the case of a wafer inspection apparatus that electrical inspection is performed as to a wafer, on which a great number of integrated circuits have been formed.

Figure 15:
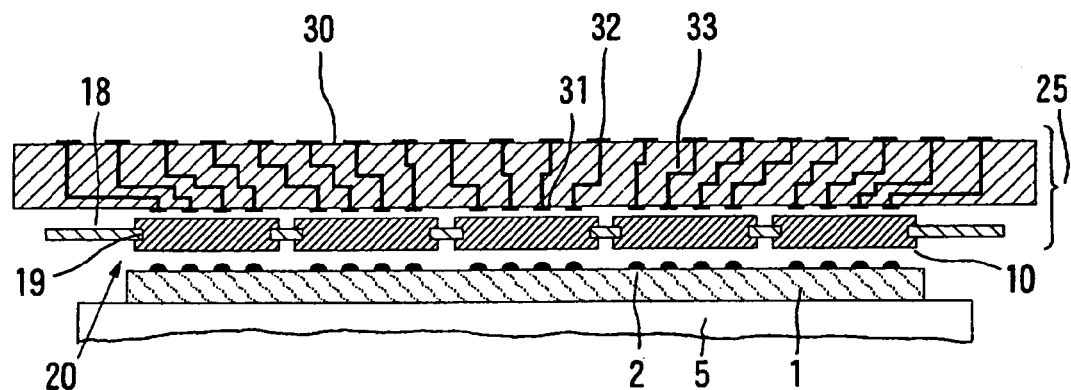
FIG. 15 is a cross-sectional view illustrating the construction of a principal part of an exemplary wafer inspection apparatus according to the present invention.

FIG. 15 is a cross-sectional view illustrating the construction of a principal part of an exemplary wafer inspection apparatus according to the present invention. This wafer inspection apparatus serves to electrically inspect a wafer, on which a great number of integrated circuits each having projected electrodes to be inspected have been formed.

Figure 16:
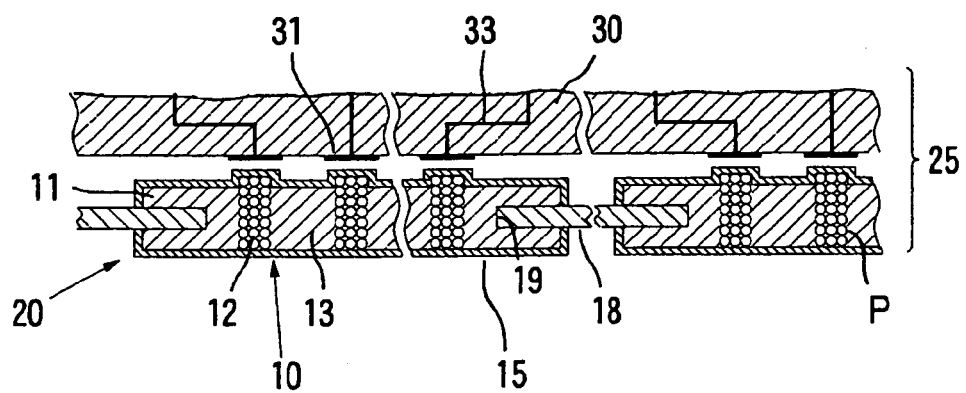
FIG. 16 is a cross-sectional view illustrating, on an enlarged scale, a principal part of an exemplary probe for circuit inspection according to the present invention.

As also illustrated on an enlarged scale in FIG. 16, the wafer inspection apparatus has a probe 25 for circuit inspection, which is composed of a circuit board 30 for inspection, on one surface (lower surface in FIGS. 15 and 16) of which a great number of inspection electrodes 31 have been formed in accordance with a pattern corresponding to a pattern of the projected electrodes to be inspected in the wafer that is an object of inspection, and the anisotropically conductive connector 20 of the construction shown in FIG. 10, which is arranged on one surface of the circuit board 30 for inspection and brought into contact with the wafer that is the object of inspection. A wafer mounting table 5, on which the wafer 1 that is the object of inspection is mounted, is provided at a position below the probe 25 for circuit inspection.

On the other surface (upper surface in the figure) of the circuit board 30 for inspection, a great number of connection terminals 32 connected to a tester are formed in accordance with a proper pattern. These connection terminals 32 are respectively electrically connected to the inspection electrodes 31 through internal wirings 33 in the circuit board 30 for inspection.

No particular limitation is imposed on a base material for the circuit board 30 for inspection so far as it has heat resistance, and various materials ordinarily used as base materials of printed circuit boards may be used. As specific examples thereof, may be mentioned resin materials such as glass fiber-reinforced epoxy resins, glass fiber-reinforced polyimide resins, glass fiber-reinforced bismaleimidotriazine resins, polyimide resins, aramid nonwoven fabric-reinforced epoxy resins, aramid nonwoven fabric-reinforced polyimide resins and aramid nonwoven fabric-reinforced bismaleimidotriazine resins, ceramic materials, glass materials, and metal core materials. When the wafer inspection apparatus is used in the burn-in test, it is however preferable to use a material having a coefficient of linear thermal expansion equivalent or close to that of a material forming the wafer that is the object of inspection. More specifically, when the wafer is composed of silicon, that having a coefficient of linear thermal expansion of at most $1.5 \times 10^{-4}$/K, particularly, $3 \times 10^{-6}$ to $8 \times 10^{-6}$/K is preferably used.

In such a wafer inspection apparatus, the inspection of a wafer 1 is conducted in the following manner.

The wafer 1, which is an object of inspection, is first arranged on the wafer mounting table 5 in such a manner that electrodes 2 to be inspected thereof are located right under respective inspection electrodes 31 of the circuit board 30 for inspection in a state that the electrodes 2 to be inspected have been turned upward. For example, the circuit board 30 for inspection is then pressurized downward by a proper pressurizing means, whereby the anisotropically conductive sheets 10 in the anisotropically conductive connector 20 are brought into contact with their corresponding electrodes 2 to be inspected of the wafer 1, and moreover held in a state pressurized by the electrodes 2 to be inspected. The conductive parts 12 in the anisotropically conductive sheet bodies 11 of the anisotropically conductive sheets 10 are elastically deformed so as to be compressed in the thickness-wise direction of the anisotropically conductive sheets corresponding to the projected height of the electrodes 2 to be inspected of the wafer 1, whereby conductive paths extending in the thickness-wise direction of the anisotropically conductive sheets 10 formed by the conductive particles P are formed in the conductive parts 12 of the anisotropically conductive sheet bodies 11 between the electrodes 2 to be inspected of the wafer 1 and the inspection electrodes 31 of the circuit board 30 for inspection. As a result, electrical connection between the electrodes 2 to be inspected of the wafer 1 and the inspection electrodes 31 of the circuit board 30 for inspection is achieved. Thereafter, the wafer 1 is heated to a prescribed temperature when the burn-in test is conducted. In this state, necessary electrical inspection is performed on the wafer 1.

According to the above-described wafer inspection apparatus, the wafer 1 can be prevented from being contaminated because the anisotropically conductive connector 20 coming into contact with the wafer 1 in the probe 25 for circuit inspection has the anisotropically conductive sheets 10, on which the DLC film 15 have been formed. In addition, the anisotropically conductive sheets 10 can be prevented from adhering to the wafer 1 even when they are left to stand for a long period of time in a state pressurized by the wafer 1 under a high-temperature environment, whereby it can be avoided to damage the anisotropically conductive sheets 10 and the wafer 1. In addition, since electric charge can be prevented or inhibited from accumulating on the surfaces of the anisotropically conductive sheets 10, an adverse influence by static electricity can be eliminated.

Figure 17:
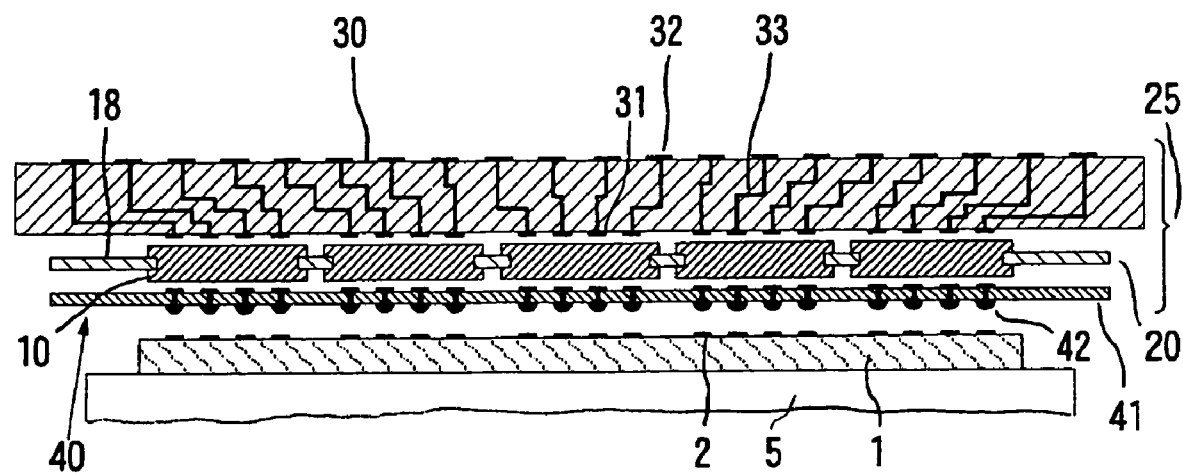
FIG. 17 is a cross-sectional view illustrating the construction of a principal part of another exemplary wafer inspection apparatus according to the present invention.

FIG. 17 is a cross-sectional view illustrating the construction of a principal part of another exemplary wafer inspection apparatus according to the present invention. This wafer inspection apparatus serves to electrically inspect a wafer, on which a great number of integrated circuits each having flat electrodes to be inspected have been formed.

Figure 18:
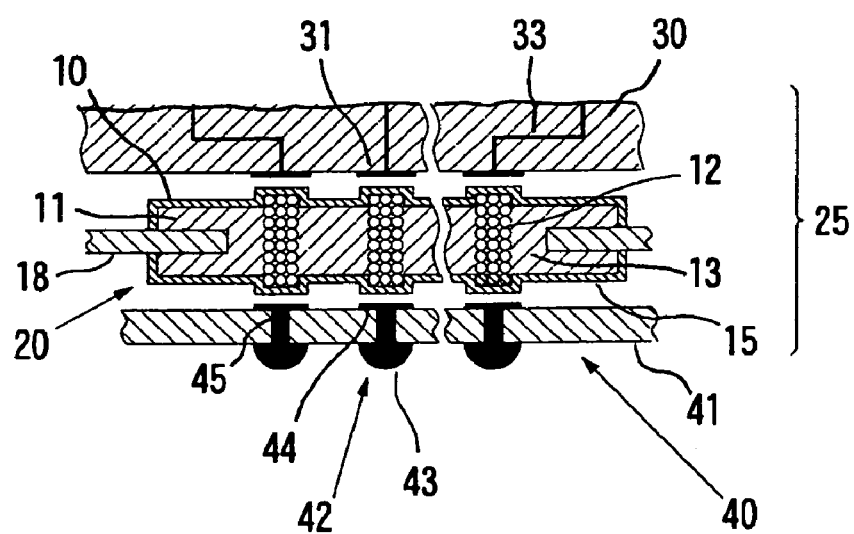
FIG. 18 is a cross-sectional view illustrating, on an enlarged scale, a principal part of another exemplary probe for circuit inspection according to the present invention.

As also illustrated on an enlarged scale in FIG. 18, the wafer inspection apparatus has a probe 25 for circuit inspection, which is composed of a circuit board 30 for inspection, on one surface (lower surface in FIGS. 17 and 18) of which a great number of inspection electrodes 31 have been formed in accordance with a pattern corresponding to a pattern of the electrodes to be inspected in the wafer that is an object of inspection, the anisotropically conductive connector 20 arranged on one surface of the circuit board 30 for inspection, and a sheet-like connector 40 arranged on one surface (lower surface in FIGS. 17 and 18) of this anisotropically conductive connector 20. A wafer mounting table 5, on which the wafer 1 that is the object of inspection is mounted, is provided at a position below the probe 25 for circuit inspection.

The circuit board 30 for inspection has the same construction as the circuit board 30 for inspection in the wafer inspection apparatus shown in FIGS. 15 and 16, and the anisotropically conductive connector 20 has the same construction as the anisotropically conductive connector 20 in the wafer inspection apparatus shown in FIGS. 15 and 16 except that the conductive parts 12 of the anisotropically conductive sheet body 11 in each of the anisotropically conductive sheets 10 thereof are formed in a state protruded from both surfaces of the insulating part 13.

The sheet-like connector 40 has a flexible insulating sheet 41, and in this insulating sheet 41, a plurality of electrode structures 42 extending in the thickness-wise direction of the insulating sheet 41 and composed of a metal are arranged in a state separated from each other in a plane direction of the insulating sheet 41 in accordance with a pattern corresponding to the pattern of the inspection electrodes 31 of the circuit board 30 for inspection, i.e., a pattern corresponding to the pattern of the electrodes 2 to be inspected of the wafer 1 that is the object of inspection. Each of the electrode structures 42 is formed by integrally connecting a projected front-surface electrode part 43 exposed to the front surface (lower surface in the figure) of the insulating sheet 41 and a plate-like back-surface electrode part 44 exposed to the back surface of the insulating sheet 41 to each other by a short circuit part 45 extending through in the thickness-wise direction of the insulating sheet 41.

The sheet-like connector 40 is arranged in such a manner that each of the electrode structures 42 thereof is located on the respective conductive parts 12 in each of the anisotropically conductive sheets 10 of the anisotropically conductive connector 20.

No particular limitation is imposed on the insulating sheet 41 so far as it has insulating property and is flexible. For example, a resin sheet formed of a polyimide resin, liquid crystal polymer, polyester, fluororesin or the like, or a sheet obtained by impregnating a cloth woven by fibers with any of the above-described resins may be used.

No particular limitation is also imposed on the thickness of the insulating sheet 41 so far as such an insulating sheet 41 is flexible. However, it is preferably 10 to 50 µm, more preferably 10 to 25 µm.

As the metal for forming the electrode structures 42, may be used nickel, copper, gold, silver, palladium, iron or the like. The electrode structures 42 may be any of those formed of a simple metal, those formed of an alloy of at least two metals and those obtained by laminating at least two metals as a whole.

On the surfaces of the front-surface electrode part 43 and back-surface electrode part 44 in the electrode structure 42, a film of a chemically stable metal having high conductivity, such as gold, silver or palladium is preferably formed in that oxidation of the electrode parts is prevented, and electrode parts small in contact resistance are obtained.

The projected height of the front-surface electrode part 43 in the electrode structure 42 is preferably 15 to 50 µm, more preferably 20 to 35 µm in that stable electrical connection to the electrode 2 to be inspected of the wafer 1 can be achieved. The diameter of the front-surface electrode part 43 is preset according to the size and pitch of the electrodes to be inspected of the wafer 1 and is, for example, 30 to 80 µm, preferably 30 to 65 µm.

The diameter of the back-surface electrode part 44 in the electrode structure 42 may be greater than the diameter of the short circuit part 45 and smaller than the arrangement pitch of the electrode structures 42 and is preferably large as much as possible, whereby stable electrical connection to the conductive parts 12 in the anisotropically conductive sheet 10 of the anisotropically conductive connector 20 can also be achieved with certainty. The thickness of the back-surface electrode part 44 is preferably 20 to 50 µm, more preferably 35 to 50 µm in that sufficiently high strength and excellent repetitive durability are achieved.

The diameter of the short circuit part 45 in the electrode structure 42 is preferably 30 to 80 µm, more preferably 30 to 65 µm in that sufficiently high strength is achieved.

The sheet-like connector 40 can be produced, for example, in the following manner.

More specifically, a laminate material obtained by laminating a metal layer on an insulating sheet 41 is provided, and a plurality of through-holes extending through in the thickness-wise direction of the insulating sheet 41 are formed in the insulating sheet 41 of the laminate material in accordance with a pattern corresponding to a pattern of electrode structures 42 to be formed by laser machining, dry etch machining or the like. This laminate material is then subjected to photolithography and plating treatment, whereby short circuit parts 45 integrally connected to the metal layer are formed in the through-holes in the insulating sheet 41, and at the same time, projected front-surface electrode parts 43 integrally connected to the respective short circuit parts 45 are formed on the front surface of the insulating sheet 41. Thereafter, the metal layer of the laminate material is subjected to a photo-etching treatment to remove a part thereof, thereby forming back-surface electrode parts 44 to form the electrode structures 42, whereby the sheet-like connector 40 is thus provided.

According to such a wafer inspection apparatus, the anisotropically conductive connector 20 coming into contact with the wafer 1 in the probe 25 for circuit inspection has the anisotropically conductive sheets 10, on which the DLC film 15 have been formed, so that the anisotropically conductive sheets 10 can be prevented from adhering to the sheet-like connector 40 even when the probe 25 for circuit inspection is left to stand for a long period of time in a pressurized state, whereby it can be avoided for the sheet-like connector to causes deflection. As a result, stable electrical connection to all electrodes to be inspected in circuit devices to be inspected can be achieved even when the wafer inspection apparatus is used repeatedly. In addition, since electric charge can be prevented or inhibited from accumulating on the surfaces of the anisotropically conductive sheets 10, an adverse influence by static electricity can be eliminated.

The probes for circuit inspection and circuit inspection apparatus according to the present invention are not limited to the above-described embodiments, and various changes may be added thereto.

For example, circuits that are an object of inspection are not limited to wafers, on which a great number of integrated circuits have been formed, and the probes and inspection apparatus may be applied to inspection apparatus for semiconductor integrated circuit devices such as semiconductor chips, and packaged ICMCM such as BGA and CSP, and circuits formed on printed circuit boards or the like.

Figure 19:
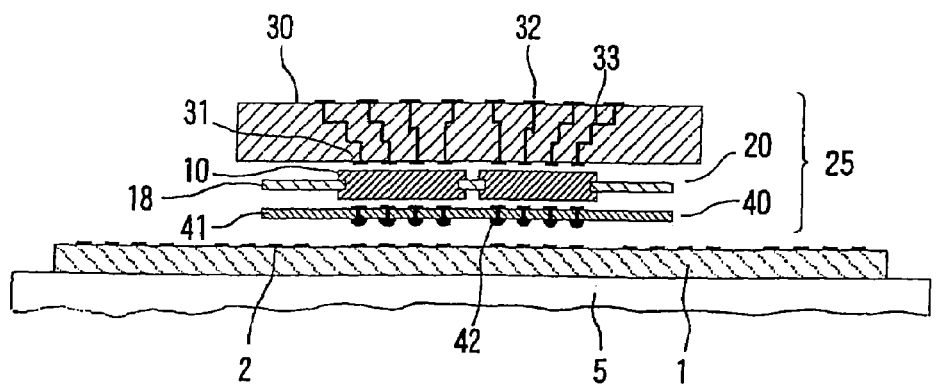
FIG. 19 is a cross-sectional view illustrating the construction of a principal part of a further exemplary wafer inspection apparatus according to the present invention.

Although both of the probe 25 for circuit inspection shown in FIG. 15 and the probe 25 for circuit inspection shown in FIG. 17 serve to achieve electrical connection to the electrodes 2 to be inspected of all the integrated circuits formed on the wafer 1 collectively, they may be those electrically connected to electrodes 2 to be inspected of a plurality of integrated circuits selected from among the respective integrated circuits formed on the wafer 1 as illustrated in FIG. 19. The number of the integrated circuits selected is suitably selected in view of the size of the wafer 1, the number of the integrated circuits formed on the wafer 1, the number of electrodes to be inspected in each integrated circuit, and the like, and is, for example, 16, 32, 64 or 128.

In the wafer inspection apparatus having such a probe 25 for circuit inspection, the probe 25 for circuit inspection is electrically connected to electrodes 2 to be inspected of a plurality of integrated circuits selected from among the respective integrated circuits formed on the wafer 1 to conduct the inspection. Thereafter, the probe 25 for circuit inspection is electrically connected to electrodes 2 to be inspected of a plurality of integrated circuits selected from among other integrated circuits to conduct the inspection. This process is repeated, whereby the electrical inspection can be conducted as to all the integrated circuit formed on the wafer 1.

The present invention will hereinafter be described specifically by the following examples. However, the present invention is not limited to these examples.

EXAMPLE 1

[Preparation of Molding Material]

After 70 parts by weight of conductive particles having a number average particle diameter of 20 µm were added to and mixed with 100 parts by weight of addition type liquid silicone rubber, the resultant mixture was subjected to a defoaming treatment by pressure reduction, thereby preparing a molding material for anisotropically conductive sheet body.

In the above process, as the conductive particles, were those (average coating amount: 25% by weight based on the weight of the core particles) obtained by using nickel particles as core particles and subjecting the core particles to electroless plating.

[Mold for Production of Anisotropically Conductive Sheet]

A mold for producing an anisotropically conductive sheet was produced fundamentally according to the construction shown in FIG. 2 under the following conditions.

Ferromagnetic Base Plates:
Material: iron, thickness: 6 mm;
Ferromagnetic Substance Layers:
Material: nickel, thickness: 0.1 mm, diameter: 0.6 mm, pitch (center distance): 0.12 mm;
Non-Magnetic Substance Layers:
Material: cured product of liquid resist, thickness: 0.125 mm;
Thickness of spacer: 0.2 mm.

[Production of Anisotropically Conductive Sheet Body]

The molding material prepared was filled into a cavity of the above-described mold, thereby forming a molding material layer in the mold.

The molding material layer was then subjected to a curing treatment under conditions of 100° C. and 1 hour while applying a parallel magnetic field of 1.8 T in a thickness-wise direction of the molding material layer by electromagnets, thereby producing an anisotropically conductive sheet body having a plurality of conductive parts each extending in the thickness-wise direction and an insulating part mutually insulating these conductive parts.

The resultant anisotropically conductive sheet body is such that the conductive parts having an outer diameter of 0.06 mm are arranged at a pitch of 0.12 mm, the thickness of the insulating part is 0.2 mm, the thickness of each conductive part is 0.25 mm, and the conductive parts are formed in a state (each projected height: 0.025 mm) protruded from both surfaces of the insulating part. A proportion of the conductive particles in the conductive parts was 25% in terms of volume fraction.

[Formation of DLC Film]

The whole of one surface of the anisotropically conductive sheet body was subjected to an ion etching treatment for 10 minutes with an argon gas ion. Thereafter, a DLC film having a thickness of 10 nm was formed on the whole surface of the anisotropically conductive sheet body under conditions of a treatment temperature of 50° C. and a treatment time of 20 minutes by means of an electron beam vapor deposition method using graphite as a solid carbon source, thereby producing an anisotropically conductive sheet according to the present invention.

The DLC film in the anisotropically conductive sheet thus obtained was cut in a grid pattern by a cutting knife to form 1-mm squares of 100 areas in total, thereby conducting a peel test for the DLC film with a Scotch Tape. As a result, 0/100 area was peeled.

The anisotropically conductive sheet was fold at about 180° with the surface, on which the DLC film had been formed, inside, and the surface was then observed. As a result, no peeling of the DLC film was observed.

A surface resistivity of the DLC film was measured by means of electric resistance meters "High Resistance Meter 4339" and "Resistivity Cell 16008B" manufactured by Hewlett-Packard Co. As a result, the resistivity was $1\times10^{12}$ $\Omega/\square$.

EXAMPLE 2

An anisotropically conductive sheet body was produced in the same manner as in Example 1, and a plate-like mask made of stainless steel, in which openings were formed in accordance with a pattern corresponding to the pattern of the conductive parts in the anisotropically conductive sheet body, was produced.

This mask was arranged on one surface of the anisotropically conductive sheet body in such a manner that the respective openings in the mask were located on their corresponding conductive parts, and the surfaces of the conductive parts exposed through the openings in the mask were subjected to an ion etching treatment for 10 minutes with an argon gas ion. Thereafter, a metal layer formed of titanium and having a thickness of 100 nm was formed on one surfaces of the conductive parts by means of an arc discharge method using an electrode formed of titanium as a cathode.

After the whole one surface of the anisotropically conductive sheet body including the metal layer was then subjected to an ion etching treatment for 10 minutes with an argon gas ion, a DLC film having a thickness of 10 nm was formed on the whole surface of the anisotropically conductive sheet body under conditions of a treatment temperature of 50° C. and a treatment time of 20 minutes by means of an electron beam vapor deposition method using graphite as a solid carbon source, thereby producing an anisotropically conductive sheet according to the present invention.

With respect to the anisotropically conductive sheet thus obtained, a peel test was conducted for the DLC film in the same manner as in Example 1. As a result, 0/100 area was peeled.

The anisotropically conductive sheet was fold at about 180° with the surface, on which the DLC film had been formed, inside, and the surface was then observed. As a result, no peeling of the DLC film was observed.

A surface resistivity of the DLC film was measured in the same manner as in Example 1. As a result, the resistivity was $1\times10^{12}$ $\Omega/\square$.

COMPARATIVE EXAMPLE 1

An anisotropically conductive sheet body was produced in the same manner as in Example 1, and this anisotropically conductive sheet body was provided as a comparative anisotropically conductive sheet.

A surface resistivity at one surface of the anisotropically conductive sheet was measured by means of electric resistance meters "High Resistance Meter 4339" and "Resistivity Cell 16008B" manufactured by Hewlett-Packard Co. As a result, the resistivity was $1\times10^{15}$ $\Omega/\square$ or higher.

[Property Evaluation of Anisotropically Conductive Sheet]

(1) Electrical Conductivity:

Each of the anisotropically conductive sheets according to Example 1 and Comparative Example 1 was pressurized in a thickness-wise direction thereof in such manner that a load applied to every conductive part amounts to 5 g. In this state, electric resistances of these conductive parts were measured. As a result, the electric resistances were 60 m$\Omega$ for the anisotropically conductive sheet according to Example 1 and 100 m$\Omega$ for the anisotropically conductive sheet according to Comparative Example 1. It was thus confirmed that good pressure-sensitive conductivity is achieved by the anisotropically conductive sheet according to Example 1 compared with the anisotropically conductive sheet according to Comparative Example 1.

Figure 20:
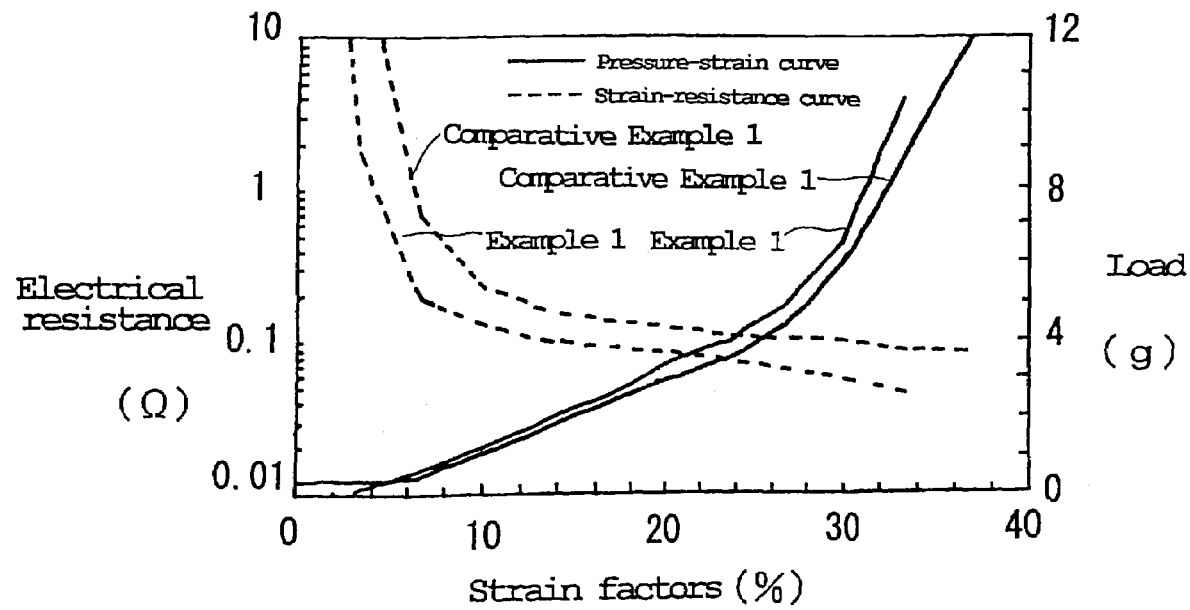
FIG. 20 illustrates pressure-strain curves and strain-resistance curves in Example 1 and Comparative Example 1.

Strain factors and electric resistance values of the conductive parts were measured while varying the load applied to the conductive parts of the anisotropically conductive sheets to prepare pressure-strain curves and strain-resistance curves. The results are illustrated in FIG. 20.

An electric resistance between adjacent conductive parts in each of the anisotropically conductive sheets was measured. As a result, the electric resistance was $1\times10^{14}$ $\Omega$ or higher in both anisotropically conductive sheet according to Example 1 and the anisotropically conductive sheet according to Comparative Example 1.

(2) Non-Adhesiveness Test:

Each of the anisotropically conductive sheets according to Examples 1 and 2 and the anisotropically conductive sheet according to Comparative Example 1 was arranged on a silicon substrate and pressurized in such a manner that a strain factor of the conductive parts thereof amounts to 30%. After the anisotropically conductive sheet was left to stand for 48 hours under an atmosphere of 150° C. in this state, adhesiveness between the anisotropically conductive sheet and the silicon substrate was investigated. As a result, the anisotropically conductive sheets according to Examples 1 and 2 did not adhere to the silicon substrate at all, and easily fell off when the silicon substrate was inclined at an angle of 90°. In the anisotropically conductive sheet according to Comparative Example 1 on the other hand, it firmly adhered to the silicon substrate. When the anisotropically conductive sheet was separated from the substrate, the anisotropically conductive sheet was broken, and a part thereof remained adhered to the silicon substrate.

When the surface of the silicon substrate, on which each of the anisotropically conductive sheets according to Examples 1 and 2 had been arranged, was observed, contamination with a low-molecular weight component of the silicon rubber was not observed at all.

(3) Charging Property:

Each of the anisotropically conductive sheets according to Examples 1 and 2 and the anisotropically conductive sheet according to Comparative Example 1 was arranged on and fixed to a circuit board for inspection, thereby producing a probe for circuit inspection. This probe for circuit inspection was arranged on a silicon substrate, and pressurized in a thickness-wise direction thereof under an environment of a temperature of 25° C. and a relative humidity of 30% in such a manner that a strain factor of the conductive parts of the anisotropically conductive sheet amounts to 25%. After the probe was held for 1 second in this state, the probe for circuit inspection was separated from the silicon substrate. After 2 seconds elapsed, the probe for circuit inspection was further pressurized in the thickness-wise direction. This process was regarded as a cycle, and the cycle was repeated 5,000 times in total. A surface potential of the anisotropically conductive sheet was measured within 40 seconds after completion of the process. As a result, the surface potentials of the anisotropically conductive sheets according to Examples 1 and 2 and Comparative Example 1 were 100 V, 50 V and 1,000 V, respectively. It was thus confirmed that the anisotropically conductive sheets according to Examples 1 and 2, electric charge can be prevented from accumulating on the surfaces of the sheets.

EXAMPLE 3

[Production of Wafer for Test]

(1) Production Example 1

Figure 21:
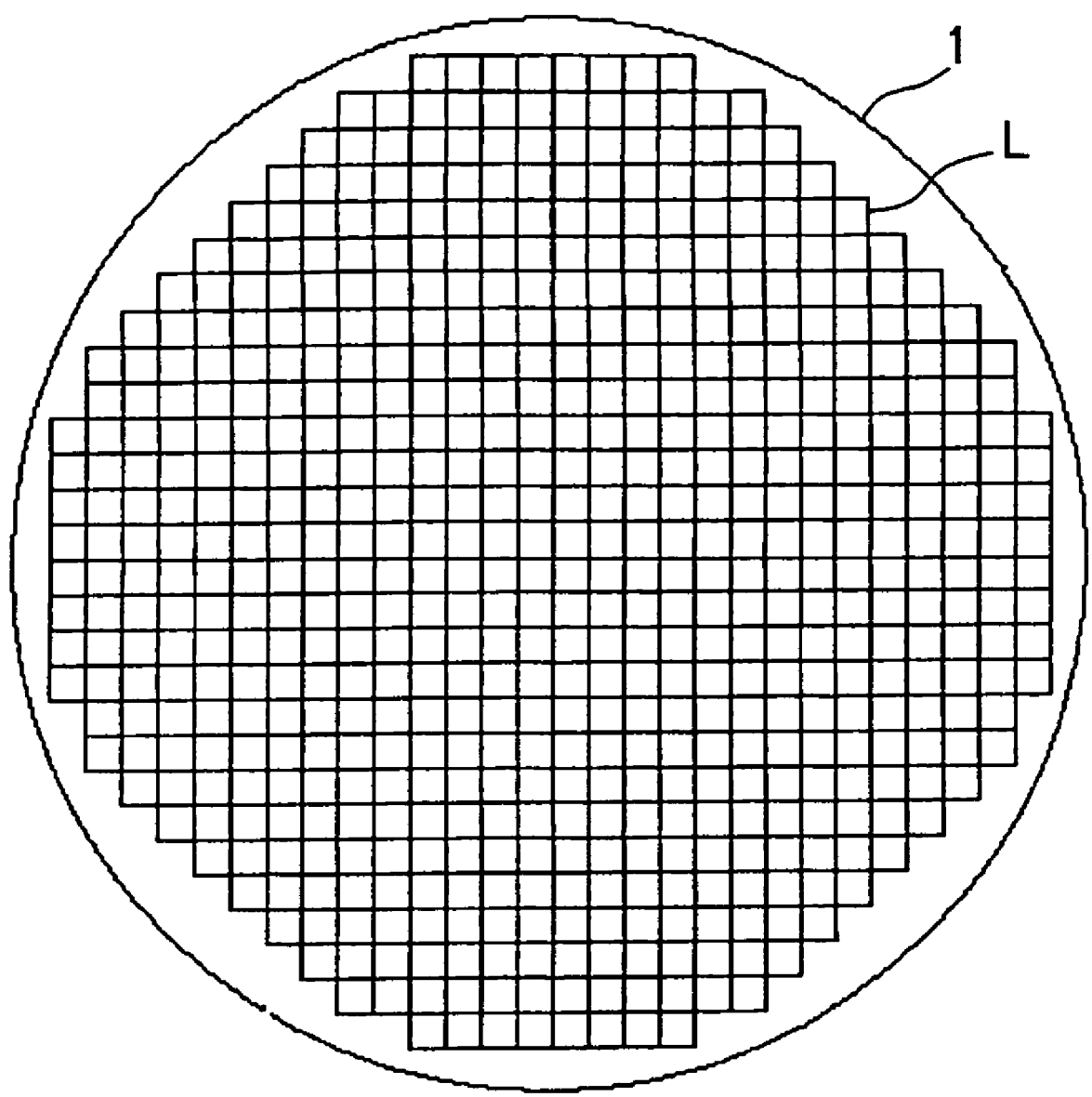
FIG. 21 is a plan view illustrating Wafer W1 for test fabricated in Example.
Figure 22:
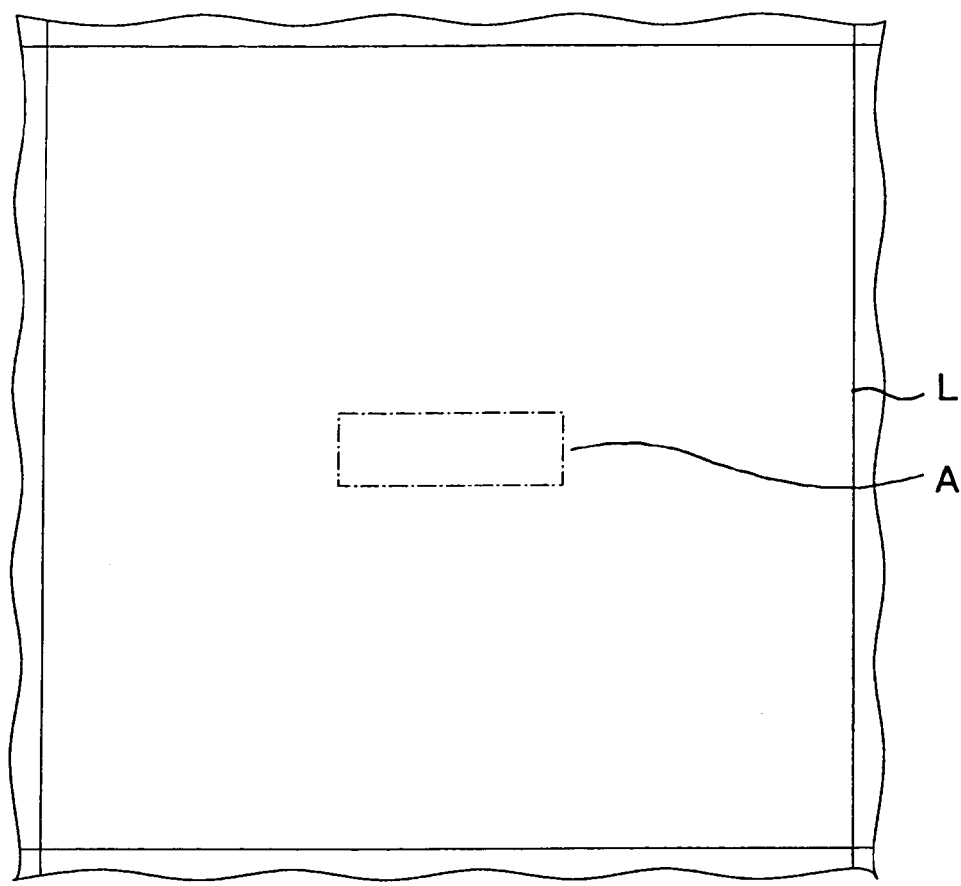
FIG. 22 illustrates a position of a region of electrodes to be inspected in an integrated circuit formed on Wafer W1 for test.
Figure 23:
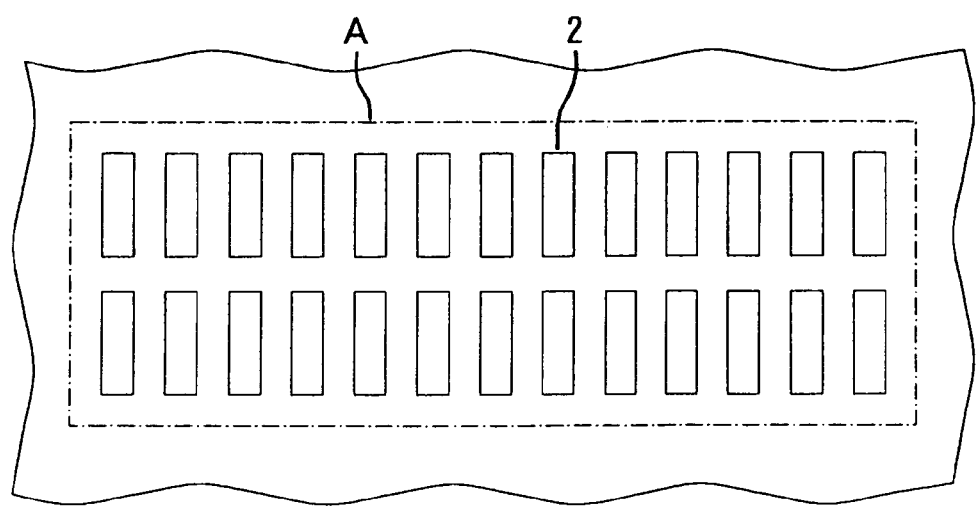
FIG. 23 illustrates the electrodes to be inspected in the integrated circuit formed on Wafer W1 for test.
Figure 24:
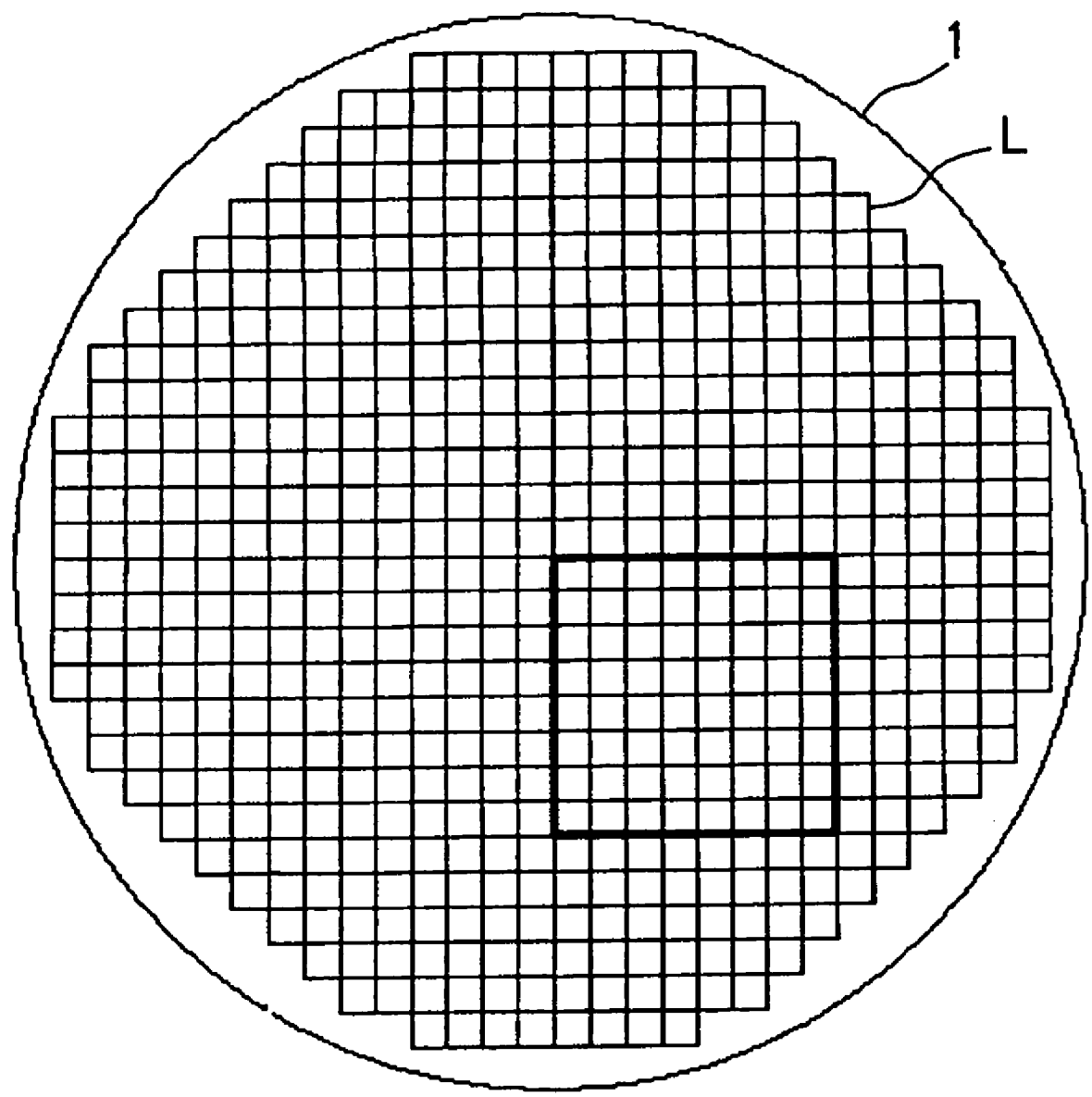
FIG. 24 illustrates Test Region E1 in Wafer W1 for test.

As illustrated in FIG. 21, 596 square integrated circuits L in total, which each had dimensions of 6.5 mm ×6.5 mm, were formed on a wafer 1 made of silicon (coefficient of linear thermal expansion: $3.3 \times 10^{-6}$/K) and having a diameter of 8 inches. Each of the integrated circuits L formed on the wafer 1 has a region A of electrodes to be inspected at its center as illustrated in FIG. 22. In the region A of the electrodes to be inspected, as illustrated in FIG. 23, 26 electrodes 2 to be inspected each having dimensions of 200 µm in a vertical direction (upper and lower direction in FIG. 23) and 60 µm in a lateral direction (left and right direction in FIG. 23) are arranged at a pitch of 120 µm in 2 lines (the number of electrodes to be inspected in a line: 13) in the lateral direction. A clearance between electrodes 2 to be inspected adjoining in the vertical direction is 250 µm. Every two electrodes among the 26 electrodes 2 to be inspected are electrically connected to each other. The electrodes 2 to be inspected are each composed of a rectangular flat plate-like aluminum pad, and the total number of the electrodes 2 to be inspected in the whole of the wafer 1 is 15,496. This wafer will hereinafter be referred to as "Wafer W1 for Test". Sixty-four integrated circuits L (8 by 8 integrated circuits in vertical and lateral directions) arranged in vertical and lateral directions as indicated by a bold line in FIG. 24 were selected from among the 596 integrated circuits formed on Wafer 1 for Test, and a region, in which these 64 integrated circuits L had been formed, was regarded as "Test Region E1".

(2) Production Example 2

On a wafer, 596 integrated circuits were formed under the same conditions as in Production Example 1 except that semispherical projected electrodes (diameter: about 80 µm, projected height: about 60 µm) composed of eutectic solder (Sb/Sn=4/6) were formed on respective aluminum pads as the electrodes to be inspected. This wafer will hereinafter be referred to as "Wafer W2 for Test". Sixty-four integrated circuits (8 by 8 integrated circuits in vertical and lateral directions) formed in a region corresponding to Test Region E1 of Wafer W1 for Test were selected from among the 596 integrated circuits formed on Wafer 2 for Test, and a region, in which these 64 integrated circuits L had been formed, was regarded as "Test Region E2".

[Production of Anisotropically Conductive Connector]

Figure 25:
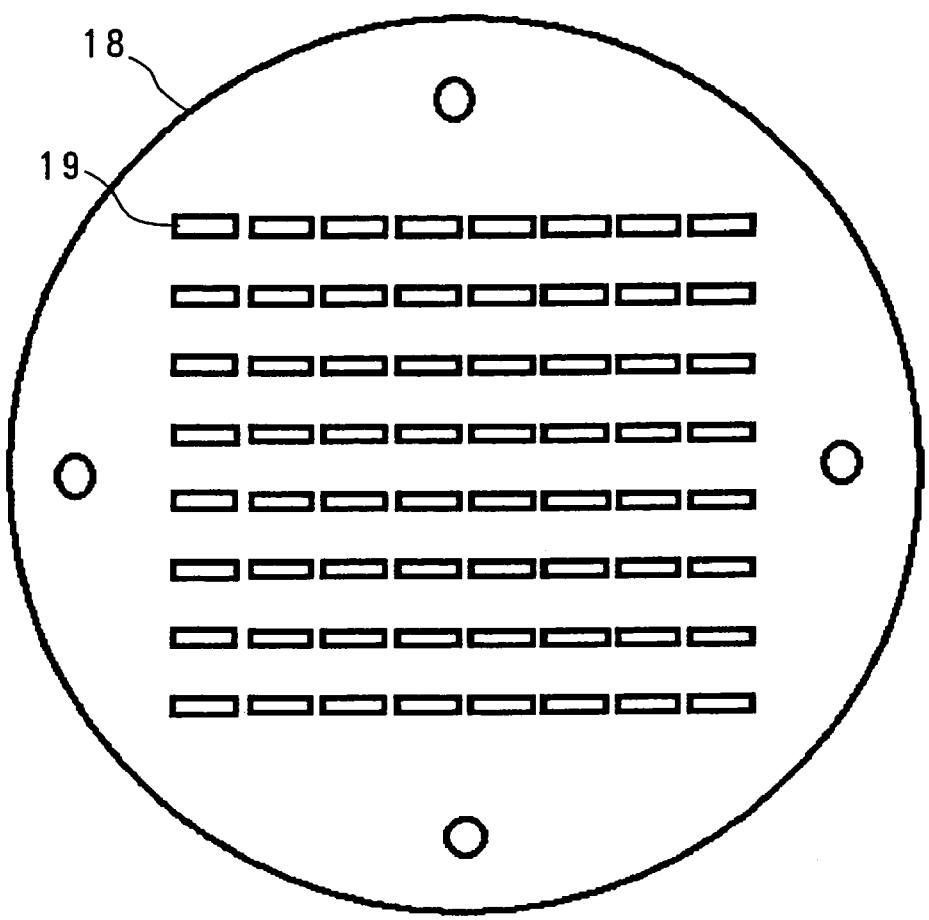
FIG. 25 is a plan view illustrating a frame plate produced in Example.

(1) Production of Frame Plate:

A frame plate 18 having a diameter of 10 cm, in which 64 openings 19 were formed correspondingly to the regions of the electrodes to be inspected in the 64-integrated circuits formed in Test Region E1 of Wafer W1 for Test as illustrated in FIG. 25, was produced. The specific specification of this frame plate 18 is as follows.

A material of the frame plate 18 is covar (saturation magnetization: 1.4 Wb/m$^2$; coefficient of linear thermal expansion: $5 \times 10^{-6}$/K), and the thickness thereof is 60 µm. Each of the openings 19 in the frame plate 18 is rectangular and has dimensions of 2,640 µm in a lateral direction (left and right direction in FIG. 25) and 900 µm in a vertical direction (upper and lower direction in FIG. 25).

(2) Production of Spacer:

Two spacers, in which a plurality of openings each having a shape corresponding to a plane shape of an anisotropically conductive sheet to be formed were formed in accordance with a pattern corresponding to the pattern of the openings in the frame plate described above, were produced. The specific specification of these spacers is as follows.

A material of the spacers is stainless steel (SUS304), and the thickness thereof is 25 µm. Each of the openings in the spacers is rectangular and has dimensions of 3,500 µm in the lateral direction and 1,600 µm in the vertical direction.

Figure 26:
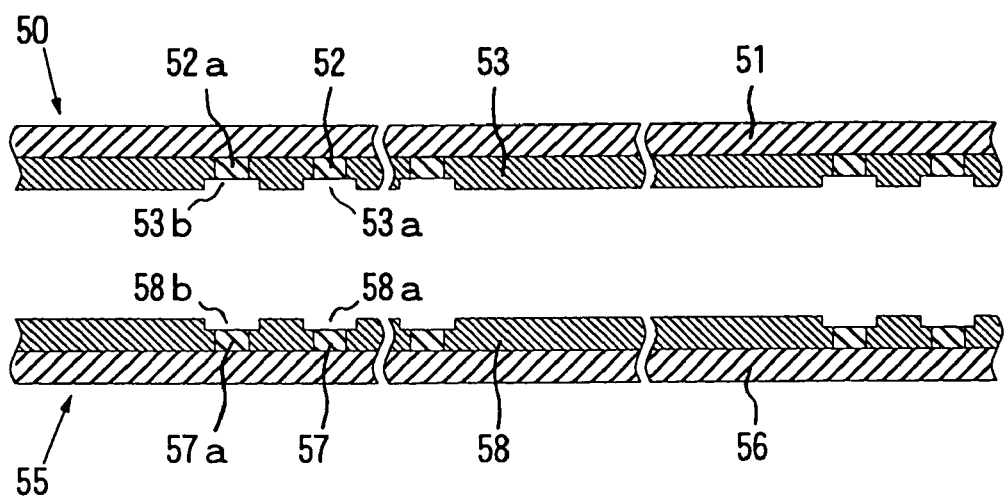
FIG. 26 is a cross-sectional view illustrating, on an enlarged scale, a principal part of a mold produced in Example.
Figure 27:
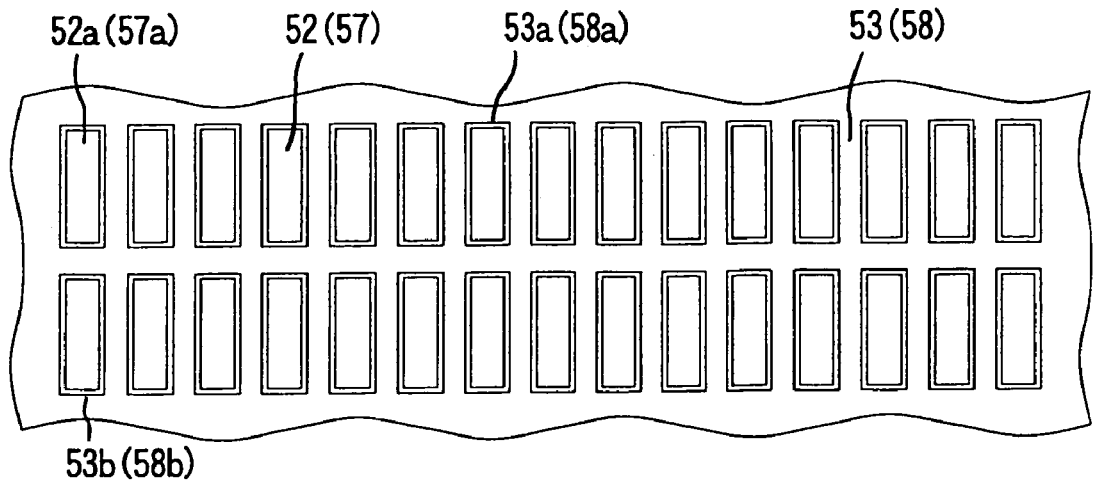
FIG. 27 illustrates, on an enlarged scale, a molding surface of the mold shown in FIG. 26.

(3) Production of Mold:

A mold for molding anisotropically conductive sheet bodies was produced under the following conditions according to the construction shown in FIGS. 26 and 27.

A top force 50 and a bottom force 55 in this mold respectively have ferromagnetic base plates 51 and 56 made of iron and each having a thickness of 6 mm. On the ferromagnetic base plates 51 and 56, ferromagnetic substance layers 52 and 57 for forming conductive parts and ferromagnetic substance layers 52a and 57a for forming conductive parts for non-connection, which are all made of nickel, are respectively arranged in accordance with a pattern corresponding to the pattern of the electrodes to be inspected in Wafer W1 for Test. More specifically, the dimensions of each of the ferromagnetic substance layers 52 and 57 for forming conductive parts are 60 µm (lateral direction)×200 µm (vertical direction)×100 µm (thickness), and 26 ferromagnetic substance layers 52 and 57 are respectively arranged at a pitch of 120 µm in 2 lines (the number of ferromagnetic substance layers 52 or 57 in a line: 13; clearance between ferromagnetic substance layers 52 or 57 adjoining in the vertical direction: 250 µm) in the lateral direction. The ferromagnetic substance layers 52a and 57a for forming conductive parts for non-connection are respectively arranged outside the ferromagnetic substance layers 52 and 57 located most outside in a direction that the ferromagnetic substance layers 52 and 57 are arranged. The dimensions of each of the ferromagnetic substance layers 52a and 57a are 60 µm (lateral direction)×200 µm (vertical direction)× 100 µm (thickness).

Corresponding to the regions of the electrodes to be inspected of the integrated circuit in Test Region E1 of Wafer W1 for Test, are formed 64 regions in total, in each of which 26 ferromagnetic substance layers 52 and 57 for forming conductive parts and 4 ferromagnetic substance layers 52a and 57a for forming conductive parts for non-connection have been formed. On the whole ferromagnetic base plate, are formed 1,664 ferromagnetic substance layers 52 and 57 for forming conductive parts and 256 ferromagnetic substance layers 52a and 57a for forming conductive parts for non-connection.

Non-magnetic substance layers 53 and 58 are formed by subjecting dry film resists to a curing treatment. The dimensions of each of recessed parts 53a and 58a, at which the ferromagnetic substance layer 52 and 57 for forming the conductive parts are respectively located, are 70 µm (lateral direction)×210 µm (vertical direction)×35 µm (depth), the dimensions of each of recessed parts 53b and 58b, at which the ferromagnetic substance layers 52a and 57a for forming the conductive parts for non-connection are located, are 70 µm (lateral direction)×210 µm (vertical direction)×35 µm (depth), and the thickness of other portions than the recessed parts is 135 µm (the thickness of the recessed parts: 100 µm).

(4) Production of Intermediate for Connector:

The above-described frame plate, spacers and mold were used to form anisotropically conductive sheet bodies in the frame plate in the following manner.

Thirty parts by weight of conductive particles were added to and mixed with 100 parts by weight of addition type liquid silicone. Thereafter, the resultant mixture was subjected to a defoaming treatment by pressure reduction, thereby preparing a molding material for anisotropically conductive sheet bodies.

In this molding material, as the conductive particles, were used those obtained by subjecting core particles composed of nickel and having an average particle diameter of 18 µm to plating with gold at 20 wt %.

As the addition type liquid silicone rubber, was used that of a two-pack type that the viscosity of Liquid A is 250 Pa·s, the viscosity of Liquid B is 250 Pa·s, and a cured product thereof has a compression set of 5% at 150° C., a durometer A hardness of 35 and tear strength of 25 kN/m.

The properties of the addition type liquid silicone rubber and the cured product thereof were determined in the following manner.

(i) Viscosity of Addition Type Liquid Silicone Rubber:

A viscosity at 23±2° C. was measured by a Brookfield viscometer.

(ii) Compression Set of Cured Product of Silicone Rubber:

Liquid A and Liquid B in the addition type liquid silicone rubber of the two-pack type were stirred and mixed in proportions that their amounts become equal. After this mixture was then poured into a mold and subjected to a defoaming treatment by pressure reduction, a curing treatment was conducted under conditions of 120° C. for 30 minutes, thereby producing a columnar body having a thickness of 12.7 mm and a diameter of 29 mm composed of a cured product of the silicone rubber. The columnar body was post-cured under conditions of 200° C. for 4 hours. The columnar body thus obtained was used as a specimen to measure its compression set at 150±2° C. in accordance with JIS K 6249.

(iii) Tear Strength of Cured Product of Silicone Rubber:

A curing treatment and post-curing of the addition type liquid silicone rubber were conducted under the same conditions as in the item (ii), thereby producing a sheet having a thickness of 2.5 mm. A crescent type specimen was prepared by punching from this sheet to measure its tear strength at 23±2° C. in accordance with JIS K 6249.

(iv) Durometer A Hardness:

Five sheets produced in the same manner as in the item (iii) were stacked on one another, and the resultant laminate was used as a specimen to measure its durometer A hardness at 23±2° C. in accordance with JIS K 6249.

The molding material prepared was applied to the surfaces of the top force and bottom force of the mold by screen printing, thereby forming molding material layers in accordance with a patter of the anisotropically conductive sheets to be formed, and the frame plate was superimposed in alignment on the molding surface of the bottom force through the spacer on the side of the bottom force. Further, the top force was superimposed in alignment on the frame plate through the spacer on the side of the top force.

The molding material layers formed between the top force and the bottom force were subjected to a curing treatment under conditions of 100° C. for 1 hour while applying a magnetic field of 1.8 T to portions located between the corresponding ferromagnetic substance layers in the thicknesswise direction by electromagnets, thereby forming an anisotropically conductive sheet body in each of the openings of the frame plate, thus producing an intermediate for connector.

The anisotropically conductive sheet bodies thus formed will be described specifically. Each of the anisotropically conductive sheet bodies has dimensions of 3,500 µm in the lateral direction and 1,600 µm in the vertical direction. In each of the anisotropically conductive sheet bodies, 26 conductive parts corresponding to the electrodes to be inspected in Wafer W1 for Test are arranged at a pitch of 120 µm in 2 lines (the number of conductive parts in a line: 13; clearance between conductive parts adjoining in the vertical direction: 250 µm) in the lateral direction. The dimensions of each of the conductive parts are 70 µm in the lateral direction, 210 µm in the vertical direction and 180 µm in thickness. The thickness of the insulating layer is 110 µm. Conductive parts for non-connection are arranged between the conductive parts located most outside in the lateral direction and the frame plate. The dimensions of each of the conductive parts for non-connection are 70 µm in the lateral direction, 210 µm in the vertical direction and 180 µm in thickness. The thickness (thickness of one of the forked portions) of the part supported by the frame plate in each of the anisotropically conductive sheet bodies is 25 µm.

The content of the conductive particles in the conductive parts in each of the anisotropically conductive sheet bodies was investigated. As a result, the content was about 30% in terms of a volume fraction in all the conductive parts.

[Formation of DLC Film]

The whole of one surface of each of the anisotropically conductive sheet bodies in the intermediate for connector thus obtained was subjected to an ion etching treatment for 10 minutes with an argon gas ion. Thereafter, a DLC film having a thickness of 10 nm was formed on the whole of one surface of the anisotropically conductive sheet body under conditions of a treatment temperature of 50° C. and a treatment time of 20 minutes by means of an electron beam vapor deposition method using graphite as a solid carbon source, thereby producing an anisotropically conductive connector according to the present invention.

A surface resistivity of the DLC film in the anisotropically conductive connector thus obtained was measured by means of electric resistance meters "High Resistance Meter 4339" and "Resistivity Cell 16008B" manufactured by Hewlett-Packard Co. As a result, the resistivity was $1 \times 10^{12}$ Ω/□.

[Production of Circuit Board for Inspection]

Alumina ceramic (coefficient of linear thermal expansion: $4.8 \times 10^{-6}$/K) was used as a base material to produce a circuit board for inspection, in which inspection electrodes were formed in accordance with a pattern corresponding to the pattern of the electrodes to be inspected of the integrated circuits in Test Region E1 of Wafer W1 for Test. This circuit board for inspection has dimensions of 10 cm×10 cm as a whole and is rectangular, and the surface accuracy thereof is ±10 µm. The inspection electrodes each have dimensions of 70 µm in the lateral direction and 210 µm in the vertical direction. This circuit board for inspection will hereinafter be referred to as "Circuit Board T for Inspection".

[Evaluation of Anisotropically Conductive Connector]

Following evaluations were made to the anisotropically conductive connector thus obtained.

Figure 28:
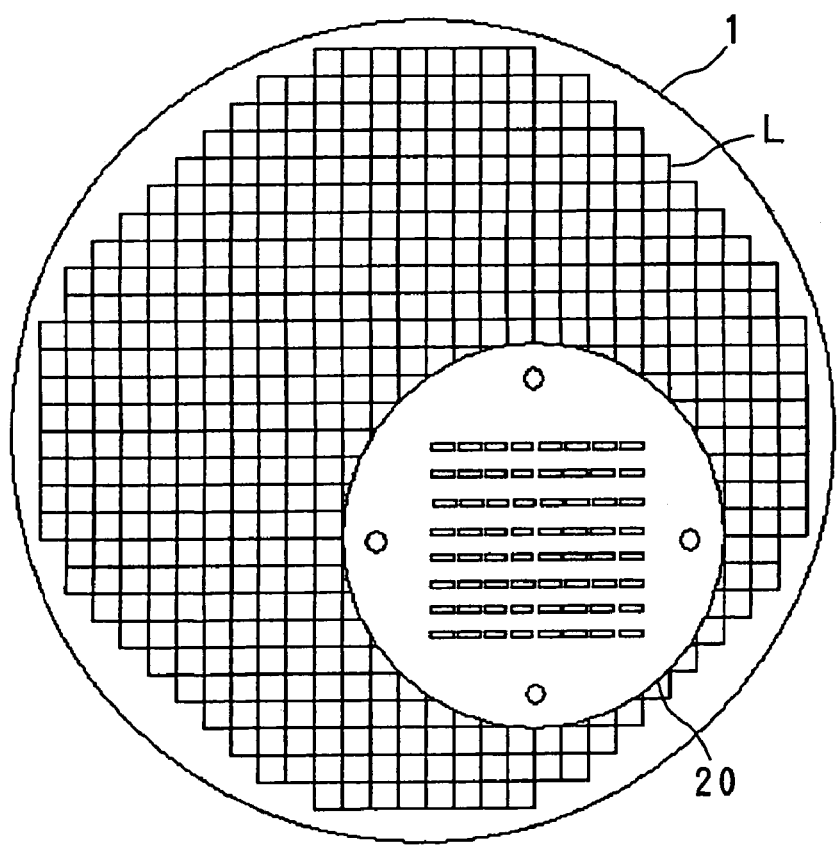
FIG. 28 illustrates a state that an anisotropically conductive connector has been arranged on Test Region E1 of Wafer W1 for test in Example.

(1) Initial Conductive Property:

Wafer W1 for Test was arranged on a test table, and the anisotropically conductive connector was arranged on Test Region E1 of this Wafer W1 for Test in alignment in such a manner that the conductive parts thereof are located on the respective electrodes to be inspected of Wafer W1 for test as illustrated in FIG. 28. Circuit Board T for Inspection was then arranged on this anisotropically conductive connector in alignment in such a manner that each of the inspection electrodes thereof are located on the respective conductive parts of the anisotropically conductive sheets in the anisotropically conductive connector.

Circuit Board T for Inspection was then pressurized downward under a prescribed load at room temperature (25° C.) to successively measure an electric resistance between each of the 1,664 inspection electrodes in Circuit Board T for Inspection and another inspection electrode electrically connected to said inspection electrode through the anisotropically conductive connector and Wafer W1 for Test, thereby calculating out respective half values of the electric resistance values measured as electric resistances (hereinafter referred to as "conduction resistances") of the conductive parts in the anisotropically conductive connector to find an average value thereof. The results are shown in Table 1.

(2) Adhesion of Electrode Material:

Wafer W2 for Test was arranged on a test table equipped with a heater, and the anisotropically conductive connector was arranged on Test Region E2 of Wafer W2 for Test in alignment in such a manner that each of the conductive parts thereof are located on the respective electrodes to be inspected of Wafer W2 for test. Circuit Board T for Inspection was then arranged on this anisotropically conductive connector in alignment in such a manner that each of the inspection electrodes thereof are located on the respective conductive parts of the anisotropically conductive sheets in the anisotropically conductive connector. Further, Circuit Board T for Inspection was pressurized downward under a load of 25 kg (load applied to every conductive part: about 15 g on the average). After the test table was then heated to 125° C. in a state that Circuit Board T for Inspection remained pressurized, and held for 24 hours in this state, the pressure against the circuit board for inspection was released, and the anisotropically conductive connector was left to stand for 1 hour. This process was regarded as a cycle, and the cycle was continuously repeated 5 times in total.

With respect to portions in each anisotropically conductive sheet in the anisotropically conductive connector, with which the electrodes to be inspected came into contact, elemental analysis was conducted by an Auger analytic electron spectroscopy to calculate out a proportion (hereinafter referred to as "Proportion S1 of Sn") of the mass of Sn that is a substance forming the electrodes to be inspected to the total mass of Sn, and Au and Ni that are substances forming the conductive particles. The results are shown in Table 2.

(3) Conductive Property in Repeated Use:

Wafer W2 for Test was arranged on a test table equipped with an electric heater, and the anisotropically conductive connector was arranged on Test Region E2 of this Wafer W2 for Test in alignment in such a manner that each of the conductive parts thereof are located on the respective electrodes to be inspected of Wafer W2 for test. Circuit Board T for Inspection was then arranged on this anisotropically conductive connector in alignment in such a manner that each of the inspection electrodes thereof are located on the respective conductive parts of the anisotropically conductive connector. Further, Circuit Board T for Inspection was pressurized downward under a load of 25 kg (load applied to every conductive part for connection: about 15 g on the average).

After the test table was then heated to 85° C. in a state that Circuit Board T for Inspection remained pressurized, conduction resistances of the respective conductive parts in the anisotropically conductive connector were successively measured. After the pressure against the circuit board for inspection was released, the test table was cooled to room temperature.

The above-described process was regarded as a cycle, and this cycle was continuously repeated 100,000 times to find an average value of the conduction resistances of the conductive parts measured in each cycle. The results are shown in Table 3.

(4) Non-Adhesiveness:

The anisotropically conductive connector was caused to intervene between a glass fiber-reinforced epoxy resin substrate plated with gold on the surface thereof and a silicon substrate, and the anisotropically conductive connector was pressurized in such a manner that a strain factor of the conductive parts thereof amounts to 30%. After the anisotropically conductive connector was left to stand for 48 hours under an atmosphere of 150° C. in this state, adhesiveness between the anisotropically conductive sheets in the anisotropically conductive connector, and the glass fiber-reinforced epoxy resin substrate and the silicon substrate was investigated.

The anisotropically conductive connector adhered to neither the glass fiber-reinforced epoxy resin substrate nor the silicon substrate. When the glass fiber-reinforced epoxy resin substrate was held and inclined, any anisotropically conductive connector was easily separated and fell off from the glass fiber-reinforced epoxy resin and silicon substrate.

When the surface of the silicon substrate was observed, contamination with a low-molecular weight component of the silicon rubber was not observed at all.

EXAMPLE 4

An anisotropically conductive connector according to the present invention was produced in the same manner as in Example 3 except that the thickness of the DLC film was changed to 5 nm. A surface resistivity of the DLC film in this anisotropically conductive connector was measured in the same manner as in Example 3. As a result, it was $1 \times 10^{12} \, \Omega/\square$.

With respect to the anisotropically conductive connector thus obtained, the initial conductive property, adhesion of electrode material and conductive property in repeated use were evaluated in the same manner as in Example 3. The results are shown in Tables 1 to 3.

With respect to the anisotropically conductive connector thus obtained, the non-adhesiveness was also evaluated in the same manner as in Example 3. As a result, the anisotropically conductive connector adhered to neither the glass fiber-reinforced epoxy resin substrate nor the silicon substrate. When the glass fiber-reinforced epoxy resin substrate was held and inclined, any anisotropically conductive connector was easily separated and fell off from the glass fiber-reinforced epoxy resin and silicon substrate.

When the surface of the silicon substrate was observed, contamination with a low-molecular weight component of the silicon rubber was not observed at all.

COMPARATIVE EXAMPLE 2

An intermediate for connector was produced in the same manner as in Example 3, and this intermediate for connector was provided as a comparative anisotropically conductive connector.

A surface resistivity at one surface of each of the anisotropically conductive sheet bodies in the anisotropically conductive connector was measured by means of electric resistance meters "High Resistance Meter 4339" and "Resistivity Cell 16008B" manufactured by Hewlett-Packard Co. As a result, the surface resistivity was $1\times10^{15}$ Ω/□ or higher.

With respect to the anisotropically conductive connector thus obtained, the initial conductive property, adhesion of electrode material and conductive property in repeated use were evaluated in the same manner as in Example 3. The results are shown in Tables 1 to 3.

With respect to the anisotropically conductive connector thus obtained, the non-adhesiveness was also evaluated in the same manner as in Example 3. As a result, the anisotropically conductive connector remained adhered to the glass fiber-reinforced epoxy resin and silicon substrate when the glass fiber-reinforced epoxy resin substrate was held and turned around at an angle of 180°, and it firmly adhered to both glass fiber-reinforced epoxy resin and silicon substrate. When the anisotropically conductive connector was forcedly separated, the anisotropically conductive sheets thereof were broken, and a part thereof remained adhered to the glass fiber-reinforced epoxy resin and silicon substrate.

EXAMPLE 5

(1) Production of Intermediate for Connector:

An intermediate for connector was produced in the same manner as in Example 3.

(2) Formation of Metal Layer:

A mask made of stainless steel, in which openings were formed in accordance with a pattern corresponding to the pattern of the conductive parts in the respective anisotropically conductive sheet bodies of the intermediate for connector, was produced.

The mask thus produced was arranged on one surfaces of the anisotropically conductive sheet bodies in the intermediate for connector in such a manner that the respective openings in the mask were located on their corresponding conductive parts, and the one surface of the conductive parts exposed through the openings in the mask were subjected to an ion etching treatment for 10 minutes with an argon gas ion. Thereafter, a metal layer formed of ruthenium and having a thickness of 100 nm was formed on the one surfaces of the conductive parts by means of an arc discharge method using an electrode formed of ruthenium as a cathode.

(3) Formation of DLC Film:

After the whole of one surfaces of the anisotropically conductive sheet bodies, including the metal layer, in the intermediate for connector, on which the metal layer had been formed, was then subjected to an ion etching treatment for 10 minutes with an argon gas ion, a DLC film having a thickness of 10 nm was formed on the whole of one surface of the anisotropically conductive sheet bodies under conditions of a treatment temperature of 50° C. and a treatment time of 20 minutes by means of an electron beam vapor deposition method using graphite as a solid carbon source, thereby producing an anisotropically conductive connector according to the present invention.

With respect to the anisotropically conductive connector thus obtained, the initial conductive property, adhesion of electrode material and conductive property in repeated use were evaluated in the same manner as in Example 3. With respect to the adhesion of the electrode material, however, a proportion (hereinafter referred to as "Proportion S2 of Sn") of the mass of Sn that is a substance forming the electrodes to be inspected to the total mass of Sn, Au and Ni that are substances forming the conductive particles, and the metal forming the metal layer was calculated out in place of Proportion S1 of Sn. The results are shown in Tables 1 to 3.

With respect to the anisotropically conductive connector thus obtained, the non-adhesiveness was also evaluated in the same manner as in Example 3. As a result, the anisotropically conductive connector adhered to neither the glass fiber-reinforced epoxy resin substrate nor the silicon substrate. When the glass fiber-reinforced epoxy resin substrate was held and inclined, any anisotropically conductive connector was easily separated and fell off from the glass fiber-reinforced epoxy resin and silicon substrate.

When the surface of the silicon substrate was observed, contamination with a low-molecular weight component of the silicon rubber was not observed at all.

EXAMPLE 6

An anisotropically conductive connector according to the present invention was produced in the same manner as in Example 5 except that the metallic material forming the cathode in the formation of the metal layer was changed from ruthenium to tungsten. The thickness of the metal layer formed of tungsten in the anisotropically conductive connector thus obtained is 100 nm.

With respect to the anisotropically conductive connector thus obtained, the initial conductive property, adhesion of electrode material and conductive property in repeated use were evaluated in the same manner as in Example 3. With respect to the adhesion of the electrode material, however, Proportion S2 of Sn was calculated out in place of Proportion S1 of Sn. The results are shown in Tables 1 to 3.

With respect to the anisotropically conductive connector thus obtained, the non-adhesiveness was also evaluated in the same manner as in Example 3. As a result, the anisotropically conductive connector adhered to neither the glass fiber-reinforced epoxy resin substrate nor the silicon substrate. When the glass fiber-reinforced epoxy resin substrate was held and inclined, any anisotropically conductive connector was easily separated and fell off from the glass fiber-reinforced epoxy resin and silicon substrate.

When the surface of the silicon substrate was observed, contamination with a low-molecular weight component of the silicon rubber was not observed at all.

EXAMPLE 7

An anisotropically conductive connector according to the present invention was produced in the same manner as in Example 5 except that the metallic material forming the cathode in the formation of the metal layer was changed from ruthenium to rhodium. The thickness of the metal layer formed of rhodium in the anisotropically conductive connector thus obtained is 100 nm.

With respect to the anisotropically conductive connector thus obtained, the initial conductive property, adhesion of electrode material and conductive property in repeated use were evaluated in the same manner as in Example 3. With respect to the adhesion of the electrode material, however, Proportion S2 of Sn was calculated out in place of Proportion S1 of Sn. The results are shown in Tables 1 to 3.

With respect to the anisotropically conductive connector thus obtained, the non-adhesiveness was also evaluated in the same manner as in Example 3. As a result, the anisotropically conductive connector adhered to neither the glass fiber-reinforced epoxy resin substrate nor the silicon substrate. When the glass fiber-reinforced epoxy resin substrate was held and inclined, any anisotropically conductive connector was easily separated and fell off from the glass fiber-reinforced epoxy resin and silicon substrate.

When the surface of the silicon substrate was observed, contamination with a low-molecular weight component of the silicon rubber was not observed at all.

COMPARATIVE EXAMPLE 3

An intermediate for connector, in which a metal layer formed of ruthenium was formed, was produced in the same manner as in Example 5, and this intermediate for connector was provided as a comparative anisotropically conductive connector.

With respect to the anisotropically conductive connector thus obtained, the initial conductive property, adhesion of electrode material and conductive property in repeated use were evaluated in the same manner as in Example 3. With respect to the adhesion of the electrode material, however, Proportion S2 of Sn was calculated out in place of Proportion S1 of Sn. The results are shown in Tables 1 to 3.

With respect to the anisotropically conductive connector thus obtained, the non-adhesiveness was also evaluated in the same manner as in Example 3. As a result, the anisotropically conductive connector remained adhered to the glass fiber-reinforced epoxy resin and silicon substrate when the glass fiber-reinforced epoxy resin substrate was held and turned around at an angle of 180°, and it firmly adhered to both glass fiber-reinforced epoxy resin and silicon substrate. When the anisotropically conductive connector was forcedly separated, the anisotropically conductive sheets thereof were broken, and a part thereof remained adhered to the glass fiber-reinforced epoxy resin and silicon substrate.

COMPARATIVE EXAMPLE 4

An intermediate for connector, in which a metal layer formed of tungsten was formed, was produced in the same manner as in Example 6, and this intermediate for connector was provided as a comparative anisotropically conductive connector.

With respect to the anisotropically conductive connector thus obtained, the initial conductive property, adhesion of electrode material and conductive property in repeated use were evaluated in the same manner as in Example 3. With respect to the adhesion of the electrode material, however, Proportion S2 of Sn was calculated out in place of Proportion S1 of Sn. The results are shown in Tables 1 to 3.

With respect to the anisotropically conductive connector thus obtained, the non-adhesiveness was also evaluated in the same manner as in Example 3. As a result, the anisotropically conductive connector remained adhered to the glass fiber-reinforced epoxy resin and silicon substrate when the glass fiber-reinforced epoxy resin substrate was held and turned around at an angle of 180°, and it firmly adhered to both glass fiber-reinforced epoxy resin and silicon substrate. When the anisotropically conductive connector was forcedly separated, the anisotropically conductive sheets thereof were broken, and a part thereof remained adhered to the glass fiber-reinforced epoxy resin and silicon substrate.

COMPARATIVE EXAMPLE 5

An intermediate for connector, in which a metal layer formed of rhodium was formed, was produced in the same manner as in Example 7, and this intermediate for connector was provided as a comparative anisotropically conductive connector.

With respect to the anisotropically conductive connector thus obtained, the initial conductive property, adhesion of electrode material and conductive property in repeated use were evaluated in the same manner as in Example 3. With respect to the adhesion of the electrode material, however, Proportion S2 of Sn was calculated out in place of Proportion S1 of Sn. The results are shown in Tables 1 to 3.

With respect to the anisotropically conductive connector thus obtained, the non-adhesiveness was also evaluated in the same manner as in Example 3. As a result, the anisotropically conductive connector remained adhered to the glass fiber-reinforced epoxy resin and silicon substrate when the glass fiber-reinforced epoxy resin substrate was held and turned around at an angle of 180°, and it firmly adhered to both glass fiber-reinforced epoxy resin and silicon substrate. When the anisotropically conductive connector was forcedly separated, the anisotropically conductive sheets thereof were broken, and a part thereof remained adhered to the glass fiber-reinforced epoxy resin and silicon substrate.

TABLE 1

| | | Average value of conduction resistances of conductive parts (Ω) | | | | | | | | |
|---|---|---|---|---|---|---|---|---|---|---|
| Load | Total | 3.3 kg | 5 kg | 6.7 kg | 8.3 kg | 10 kg | 11.6 kg | 15 kg | 20 kg | 25 kg |
| | Par 1 conductive part | 2 g | 3 g | 4 g | 5 g | 6 g | 7 g | 9 g | 12 g | 15 g |
| Example 3 | | 1.1 | 0.63 | 0.41 | 0.26 | 0.14 | 0.12 | 0.1 | 0.09 | 0.08 |
| Example 4 | | 1.2 | 0.61 | 0.43 | 0.25 | 0.15 | 0.11 | 0.1 | 0.1 | 0.1 |
| Example 5 | | 1.1 | 0.58 | 0.34 | 0.19 | 0.11 | 0.06 | 0.05 | 0.06 | 0.06 |
| Example 6 | | 1.2 | 0.65 | 0.42 | 0.16 | 0.11 | 0.09 | 0.08 | 0.06 | 0.05 |
| Example 7 | | 0.95 | 0.61 | 0.41 | 0.2 | 0.13 | 0.08 | 0.07 | 0.07 | 0.06 |
| Comparative Example 2 | | 5.7 | 1.3 | 0.82 | 0.44 | 0.23 | 0.2 | 0.17 | 0.16 | 0.15 |
| Comparative Example 3 | | 1.4 | 0.61 | 0.4 | 0.21 | 0.15 | 0.13 | 0.12 | 0.1 | 0.1 |
| Comparative Example 4 | | 1.3 | 0.65 | 0.43 | 0.23 | 0.14 | 0.11 | 0.1 | 0.1 | 0.1 |
| Comparative Example 5 | | 1.1 | 0.57 | 0.35 | 0.19 | 0.11 | 0.1 | 0.1 | 0.09 | 0.1 |

TABLE 2

|  | Metal layer | Proportion of Sn S1 | Proportion of Sn S2 |
|---|---|---|---|
| Example 3 | None | 0 | — |
| Example 4 | None | 0 | — |
| Example 5 | Ruthenium | — | 0 |
| Example 6 | Tungsten | — | 0 |
| Example 7 | Rhodium | — | 0 |
| Comparative Example 2 | None | 0.51 | — |
| Comparative Example 3 | Ruthenium | — | 0.11 |
| Comparative Example 4 | Tungsten | — | 0.13 |
| Comparative Example 5 | Rhodium | — | 0.16 |

TABLE 3

| | Average value of conduction resistances of conductive parts ($\Omega$) Number of cycles | | | | | | | | |
|---|---|---|---|---|---|---|---|---|---|
| | 1 | 1000 | 5000 | 10000 | 20000 | 36000 | 50000 | 70000 | 100000 |
| Example 3 | 0.1 | 0.08 | 0.05 | 0.05 | 0.06 | 0.11 | 0.23 | 0.28 | 0.53 |
| Example 4 | 0.1 | 0.08 | 0.1 | 0.13 | 0.15 | 0.16 | 0.34 | 0.54 | 0.83 |
| Example 5 | 0.05 | 0.08 | 0.09 | 0.12 | 0.13 | 0.17 | 0.29 | 0.48 | 0.73 |
| Example 6 | 0.08 | 0.05 | 0.06 | 0.08 | 0.11 | 0.14 | 0.25 | 0.33 | 0.59 |
| Example 7 | 0.07 | 0.1 | 0.08 | 0.11 | 0.14 | 0.15 | 0.26 | 0.39 | 0.74 |
| Comparative Example 2 | 0.16 | 0.05 | 0.07 | 0.73 | >10 | | Not measured | | |
| Comparative Example 3 | 0.12 | 0.21 | 0.54 | 1.4 | >10 | | Not measured | | |
| Comparative Example 4 | 0.1 | 0.43 | 0.81 | 3.2 | >10 | | Not measured | | |
| Comparative Example 5 | 0.1 | 0.11 | 0.12 | 0.11 | 0.43 | 1.3 | >10 | Not measured | |

The invention claimed is:

1. An anisotropically conductive sheet formed as a connector suitable for use in electrically inspecting circuits, comprising:
   an anisotropically conductive sheet body formed by an elastic polymeric substance of silicone rubber and having a plurality of conductive parts extending in a thickness-wise direction of the sheet body and an insulating part mutually insulating these conductive parts, and
   a DLC film integrally formed so as to cover all of one or both surfaces of the anisotropically conductive sheet body, wherein
   surface resistivity of the DLC film is $1\times10^8$ to $1\times10^{14}$ $\Omega/\square$, and thickness of the DLC film is 1 to 500 nm.

2. An anisotropically conductive sheet formed as a connector suitable for electrically inspecting integrated circuits formed on a wafer, comprising:
   an anisotropically conductive sheet body formed by an elastic polymeric substance of silicone rubber and having a plurality of conductive parts extending in a thickness-wise direction of the sheet body and an insulating part mutually insulating these conductive parts,
   a metal layer integrally formed on one surface of the anisotropically conductive sheet body so as to cover the conductive parts, and
   a DLC film integrally formed so as to cover a surface of the metal layer, wherein surface resistivity of the DLC film is $1\times10^8$ to $1\times10^{14}$ $\Omega/\square$, and thickness of the DLC film is 1 to 500 nm.

3. The anisotropically conductive sheet according to claim 2, wherein surface resistivity of the metal layer is at most $1\times10^{-2}$ $\Omega/\square$.

4. The anisotropically conductive sheet according to claim 2, wherein thickness of the metal layer is 5 to 1,000 nm.

5. An anisotropically conductive connector comprising a frame plate having openings and the anisotropically conductive sheet according to claim 1, which is arranged so as to close each of the openings in the frame plate and supported by an opening edge of the frame plate.

6. An anisotropically conductive connector suitable for use in conducting electrical inspection of each of a plurality of integrated circuits formed on a wafer in a state of the wafer, which comprises: a frame plate, in which a plurality of openings have been formed correspondingly to regions, in which electrodes to be inspected have been arranged, in all the integrated circuits formed on the wafer, which are each an object of inspection, and a plurality of anisotropically conductive sheets respectively arranged so as to close the openings in the frame plate and supported by their corresponding opening edges of the frame plate, wherein the anisotropically conductive sheets are each composed of the anisotropically conductive sheet according to claim 1.

7. An anisotropically conductive connector suitable for use in conducting electrical inspection of each of a plurality of integrated circuits formed on a wafer in a state of the wafer, which comprises: a frame plate, in which a plurality of openings have been formed correspondingly to regions, in which electrodes to be inspected have been arranged, in a plurality of integrated circuits selected from among the integrated circuits formed on the wafer, which are each an object of inspection, and a plurality of anisotropically conductive sheets respectively arranged so as to lose the openings in the frame plate and supported by their corresponding opening edges of the frame plate, wherein the anisotropically conductive sheets are each composed of the anisotropically conductive sheet according to claim 1.

8. A probe for circuit inspection, which comprises a circuit board for inspection, on a surface of which inspection electrodes have been formed in accordance with a pattern corresponding to a pattern of electrodes to be inspected of circuits, which are objects of inspection, and the anisotropically conductive sheet according to claim 1, which is arranged on the surface of the circuit board for inspection.

9. A probe for circuit inspection that is suitable for use in conducting electrical inspection of each of a plurality of integrated circuits formed on a wafer in a state of the wafer, which comprises:
   a circuit board for inspection, on a surface of which inspection electrodes have been formed in accordance with a pattern corresponding to a pattern of electrodes to be inspected in all the integrated circuits formed on the wafer, which is an object of inspection, and the anisotropically conductive connector according to claim 6, which is arranged on the surface of the circuit board for inspection.

10. A probe for circuit inspection that is suitable for use in conducting electrical inspection of each of a plurality of integrated circuits formed on a wafer in a state of the wafer, which comprises:

a circuit board for inspection, on a surface of which inspection electrodes have been formed in accordance with a pattern corresponding to a pattern of electrodes to be inspected in a plurality of integrated circuits selected from among the integrated circuits formed on the wafer, which is an object of inspection, and the anisotropically conductive connector according to claim 7, which is arranged on the surface of the circuit board for inspection.

11. The probe for circuit inspection according to claim 9, wherein a sheet-like connector composed of an insulating sheet and a plurality of electrode structures each extending through in a thickness-wise direction of the insulating sheet and arranged in accordance with a paffern corresponding to the pattern of the inspection electrodes in the circuit board for inspection is arranged on the anisotropically conductive connector.

12. A circuit inspection apparatus comprising the probe for circuit inspection according to claim 8.

* * * * *